US009424830B2

(12) United States Patent
Togawa et al.

(10) Patent No.: US 9,424,830 B2
(45) Date of Patent: Aug. 23, 2016

(54) APPARATUS AND METHOD FOR ENCODING AUDIO SIGNAL, SYSTEM AND METHOD FOR TRANSMITTING AUDIO SIGNAL, AND APPARATUS FOR DECODING AUDIO SIGNAL

(71) Applicant: FUJITSU LIMITED, Kawasaki-shi, Kanagawa (JP)

(72) Inventors: Taro Togawa, Kawasaki (JP); Chisato Shioda, Kawasaki (JP); Yohei Kishi, Kawasaki (JP); Takeshi Otani, Kawasaki (JP); Masanao Suzuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 119 days.

(21) Appl. No.: 14/093,798

(22) Filed: Dec. 2, 2013

(65) Prior Publication Data

US 2014/0161269 A1 Jun. 12, 2014

(30) Foreign Application Priority Data

Dec. 6, 2012 (JP) ................................ 2012-267142

(51) Int. Cl.
*H03G 3/00* (2006.01)
*G10K 15/00* (2006.01)
(Continued)

(52) U.S. Cl.
CPC .............. *G10K 15/00* (2013.01); *G10L 19/032* (2013.01); *G10L 19/167* (2013.01); *G10K 15/12* (2013.01); *H04S 7/305* (2013.01)

(58) Field of Classification Search
CPC ....... G10K 15/00; G10K 15/10; G10K 15/12; G10L 19/167; G10L 19/032; A61K 2300/00; G06Q 30/0275; A01N 25/04; A01N 25/16; A01N 47/02; G10H 1/0091; G10H 2210/281; H04S 7/305
USPC ........... 381/63, 71.1, 93–98, 17, 27, 309, 58, 381/59, 61, 62, 66, 71.12, 94.4; 705/14.71, 705/14.45; 180/65.265; 477/4; 903/930; 704/203, 204, 205, 226, 228, 233, 260, 704/270
See application file for complete search history.

(56) References Cited

U.S. PATENT DOCUMENTS 5,058,076 A * 10/1991 Kiuchi ..................... G06F 7/76 365/194
5,475,789 A 12/1995 Nishiguchi
(Continued)

FOREIGN PATENT DOCUMENTS

EP 0869622 A2 10/1998
JP 5-248972 9/1993
(Continued)

OTHER PUBLICATIONS

Extended European Search Report dated Apr. 22, 2014 in corresponding European Patent Application No. 13195452.1.
(Continued)

*Primary Examiner* — Khai N Nguyen
(74) *Attorney, Agent, or Firm* — Staas & Halsey LLP

(57) ABSTRACT

An audio signal encoding apparatus includes a processor to quantize an audio signal, to obtain a characteristic of reverberation masking that is exerted on a sound represented by the audio signal by reverberation of the sound generated in a reproduction environment by reproducing the sound, and to control a quantization step size of the audio signal that quantized based on the characteristic of the reverberation masking.

10 Claims, 18 Drawing Sheets

(51) Int. Cl.

| | |
|---|---|
| ***G10L 19/032*** | (2013.01) |
| ***G10L 19/16*** | (2013.01) |
| *G10K 15/12* | (2006.01) |
| *H04S 7/00* | (2006.01) |

(56) References Cited

U.S. PATENT DOCUMENTS

| | | | | |
|---|---|---|---|---|
| 6,154,552 | A * | 11/2000 | Koroljow et al. | 381/313 |
| 7,936,887 | B2 * | 5/2011 | Smyth | H04S 7/304 381/309 |
| 8,284,947 | B2 * | 10/2012 | Giesbrecht | H04M 9/08 379/406.14 |
| 8,515,104 | B2 * | 8/2013 | Dickins | H04S 7/306 381/17 |
| 8,761,410 | B1 * | 6/2014 | Avendano | H04M 9/085 381/17 |
| 2006/0045294 | A1 * | 3/2006 | Smyth | H04S 7/304 381/309 |
| 2006/0115095 | A1 * | 6/2006 | Giesbrecht | H04M 9/08 381/66 |
| 2007/0297616 | A1 * | 12/2007 | Plogsties et al. | 381/23 |
| 2008/0281602 | A1 | 11/2008 | Van Schijndel et al. | |
| 2009/0089049 | A1 * | 4/2009 | Moon et al. | 704/200.1 |
| 2011/0170721 | A1 * | 7/2011 | Dickins | H04S 7/306 381/309 |

FOREIGN PATENT DOCUMENTS

| | | | |
|---|---|---|---|
| JP | 9-321628 | | 12/1997 |
| JP | 2000-148191 | | 5/2000 |
| JP | 2002-123298 | | 4/2002 |
| JP | 2007-271686 | | 10/2007 |
| JP | 2008-503793 | | 2/2008 |
| WO | 2005/122640 | A1 | 12/2005 |
| WO | 2012/010929 | A1 | 1/2012 |

OTHER PUBLICATIONS

Zarouchas et al., "Perceptually Motivated Signal-Dependent Processing for Sound Reproduction in Reverberant Rooms", J. Audio Eng. Soc., vol. 59, No. 4, Apr. 2011, pp. 187-200.

Chinese Office Action for Application No. 201310641777.1 dated Apr. 14, 2016.

* cited by examiner

| TYPE OF REPRODUCTION ENVIRONMENT | REVERBERATION CHARACTERISTIC |
|---|---|
| SMALL LIVING ROOM | A |
| LARGE LIVING ROOM | B |
| BATHROOM | C |
| : | : |

FIG. 7

APPARATUS AND METHOD FOR ENCODING AUDIO SIGNAL, SYSTEM AND METHOD FOR TRANSMITTING AUDIO SIGNAL, AND APPARATUS FOR DECODING AUDIO SIGNAL

CROSS-REFERENCE TO RELATED APPLICATIONS

This application is based upon and claims the benefit of priority of the prior Japanese Patent Application No. 2012-267142, filed on Dec. 6, 2012, the entire contents of which are incorporated herein by reference.

FIELD

The embodiments discussed in the specification are related to techniques for encoding, decoding, and transmitting an audio signal.

BACKGROUND

In multimedia broadcasting for mobile application, there is a demand for low-bit-rate transmission. For an audio signal such as that of a sound, an encoding is employed in which only a perceivable sound, for example, is encoded and transmitted taking a human auditory characteristic into consideration.

As a conventional technique for encoding, the following technique is known (for example, Japanese Patent Laid-Open No. 9-321628). An audio encoding apparatus includes: an input data memory for temporarily storing input audio signal data that is split into a plurality of frames; a frequency division filter bank for producing frequency-divided data for each frame; a psycho-acoustic analysis unit for receiving i number of frames with a frame which is sandwiched between the i number of frames, and for which a quantization step size is to be calculated, and calculating the quantization step size by using the result of a spectrum analysis for a pertinent frame and a human auditory characteristic including an effect of masking; a quantizer for quantizing an output of the frequency division filter bank with the quantization step size indicated by the psycho-acoustic analysis unit; and a multiplexer for multiplexing the data quantized by the quantizer. The psycho-acoustic analysis unit includes a spectrum calculator for performing a frequency analysis on a frame, a masking curve predictor for calculating a masking curve, and a quantization step size predictor for calculating the quantization step size.

Further, as another conventional technique, the following technique is known (for example, Japanese Patent Laid-Open No. 2007-271686). In the case of an audio signal such as that of music, many of the signal components (maskees) eliminated by compression are attenuated components that were maskers before. Thus, by giving reverberation to a decompressed audio signal, signal components that were maskers before but are now maskees are incorporated into a current signal to restore the audio signal of an original sound in a pseudo manner. Since a human auditory masking characteristic varies depending on frequency, the audio signal is divided into sub-band signals in a plurality of frequency bands, and reverberation of a characteristic conforming to a masking characteristic of each frequency band is given to the sub-band signal.

Moreover, the following technique is known (for example, National Publication of International Patent Application No. 2008-503793). In an encoder, an audio signal is divided into a signal portion with no echo and information on the reverberant field relating to the audio signal, and the audio signal is preferably divided with an expression using a very slight parameter such as a reverberation time and a reverberation amplitude. Then, the signal with no echo is encoded with an audio codec. In a decoder, the signal portion with no echo is restored with the audio codec.

[Patent Document 1] Japanese Laid-open Patent Publication No. 09-321628

[Patent Document 2] Japanese Laid-open Patent Publication No. 2007-271686

[Patent Document 3] Japanese National Publication of International Patent Application No. 2008-503793

SUMMARY

According to an aspect of the embodiments, an audio signal encoding apparatus includes: a quantizer for quantizing an audio signal; a reverberation masking characteristic obtaining unit for obtaining a characteristic of reverberation masking that is exerted on a sound represented by the audio signal by reverberation of the sound generated in a reproduction environment by reproducing the sound; and a control unit for controlling a quantization step size of the quantizer based on the characteristic of the reverberation masking.

According to an aspect of the embodiments, there is provided an advantage of enabling an even lower bit rate.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram illustrating a configuration example of data stored in a reverberation characteristic storage unit 612;

DESCRIPTION OF EMBODIMENTS

Embodiments of the invention will be described in detail below with reference to the drawings.

Before describing the embodiments, a common technique will be described.

Figure 1:
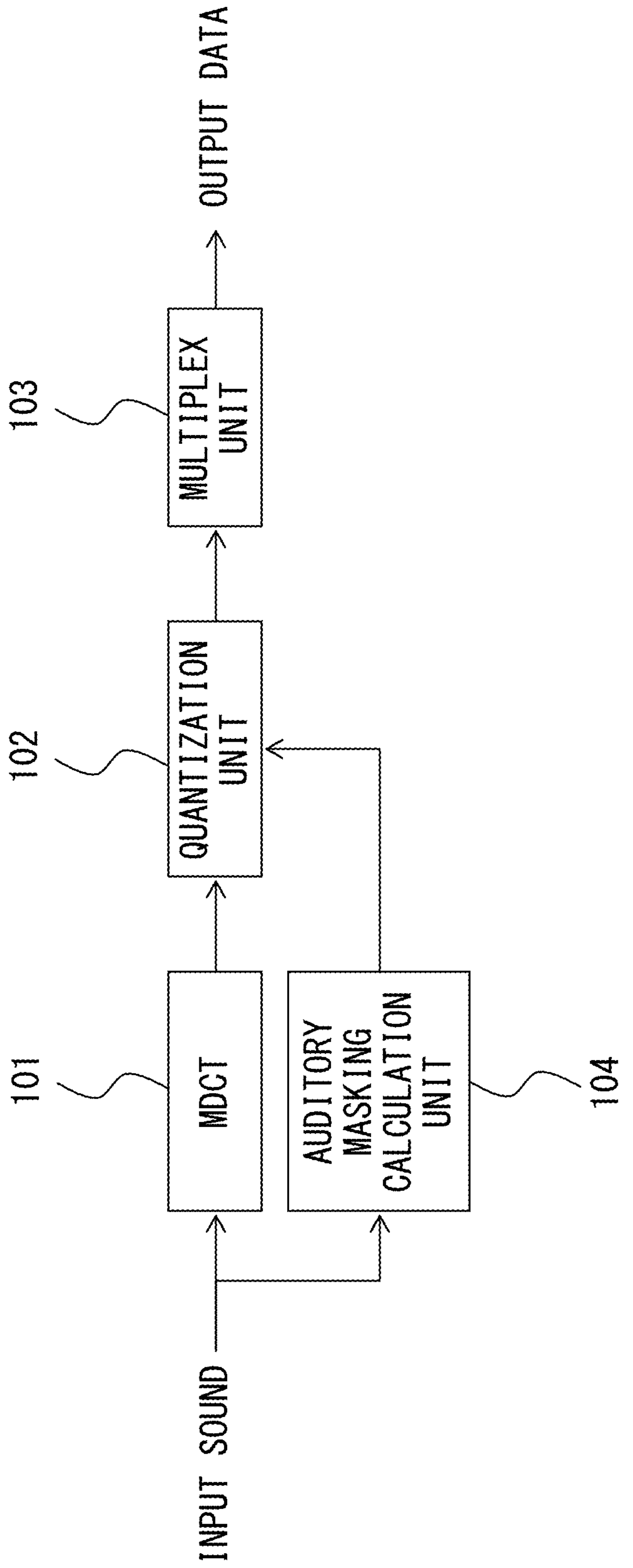
FIG. 1 is a diagram illustrating a configuration example of a common encoding apparatus for improving the sound quality of an input audio signal in encoding of the input audio signal.

FIG. 1 is a diagram illustrating a configuration example of a common encoding apparatus for improving the sound quality of an input audio signal in encoding of the input audio signal.

A Modified Discrete Cosine Transform (MDCT) unit 101 converts an input sound that is input as a discrete signal into a signal in a frequency domain. A quantization unit 102 quantizes frequency signal components in the frequency domain. A multiplex unit 103 multiplexes the pieces of quantized data that are quantized for the respective frequency signal components, into an encoded bit stream, which is output as output data.

An auditory masking calculation unit 104 performs a frequency analysis for each frame of a given length of time in the input sound. The auditory masking calculation unit 104 calculates a masking curve with taking into consideration the calculation result of the frequency analysis and masking effect that is the human auditory characteristic, calculates a quantization step size for each piece of quantized data based on the masking curve, and notifies the quantization step size to the quantization unit 102. The quantization unit 102 quantizes the frequency signal components in the frequency domain output from the MDCT unit 101 with the quantization step size notified from the auditory masking calculation unit 104.

Figure 2:
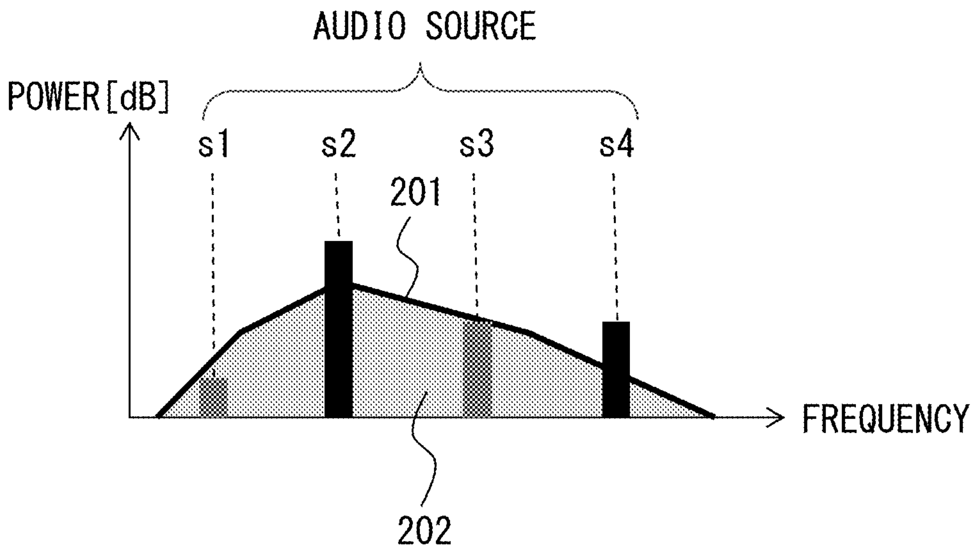
FIG. 2 is a schematic diagram illustrating an operation and effect of the encoding apparatus according to the configuration of FIG. 1.

FIG. 2 is a schematic diagram illustrating a functional effect of the encoding apparatus according to the configuration of FIG. 1.

For example, assume that the input sound of FIG. 1 schematically contains audio source frequency signal components illustrated as S1, S2, S3, and S4 of FIG. 2. In this case, a human has, for example, a masking curve (a frequency characteristic) indicated by reference numeral 201 with respect to the power value of the audio source S2. That is, presence of the audio source S2 in the input sound causes the human to hardly hear a sound of frequency power components within a masking range 202 of which the power value is smaller than that of the masking curve 201 of FIG. 2. In other words, the frequency power components are masked.

Accordingly, since this portion is hardly heard by nature, it is wasteful, in FIG. 2, to perform quantization by assigning a fine quantization step size to each of the frequency signal components of the audio source S1 and the audio source S3 of which the power values are within the masking range 202. On the other hand, it is preferable, in FIG. 2, to assign the fine quantization step size with respect to the audio sources S2 and S4 of which the power values exceed the masking range 202 because the human can recognize these audio sources well.

In view of this, in the encoding apparatus of FIG. 2, the auditory masking calculation unit 104 performs a frequency analysis on the input sound to calculate the masking curve 201 of FIG. 2. The auditory masking calculation unit 104 then makes the quantization step size coarse for a frequency signal component of which the power value is estimated to be within a range smaller than the masking curve 201. On the other hand, the auditory masking calculation unit 104 makes the quantization step size fine for a frequency signal component of which the power value is estimated to be within a range larger than the masking curve 201.

In this manner, the encoding apparatus having the configuration of FIG. 1 makes the quantization step size coarse for a frequency signal component which is unnecessary to be heard finely, to reduce an encoding bit rate, improving the encoding efficiency thereof.

Consider a case, in such an encoding apparatus, where a sampling frequency of an input sound is 48 kHz, the input sound is a stereo audio, and an encoding scheme thereof is an AAC (Advanced Audio Coding) scheme. In this case, a bit rate of, for example, 128 kbps having a CD (Compact Disk) sound quality is supposed to provide enhanced encoding efficiency by using the encoding apparatus having the configuration of FIG. 1. But, under a low-bit-rate condition such as 96 kbps or less having a streaming audio quality, or to an extent of a telephone communication quality of a mobile phone, a sound quality of an encoded sound deteriorates. It is therefore requested to reduce an encoding bit rate without deteriorating a sound quality even under such a low-bit-rate condition.

Figure 3:
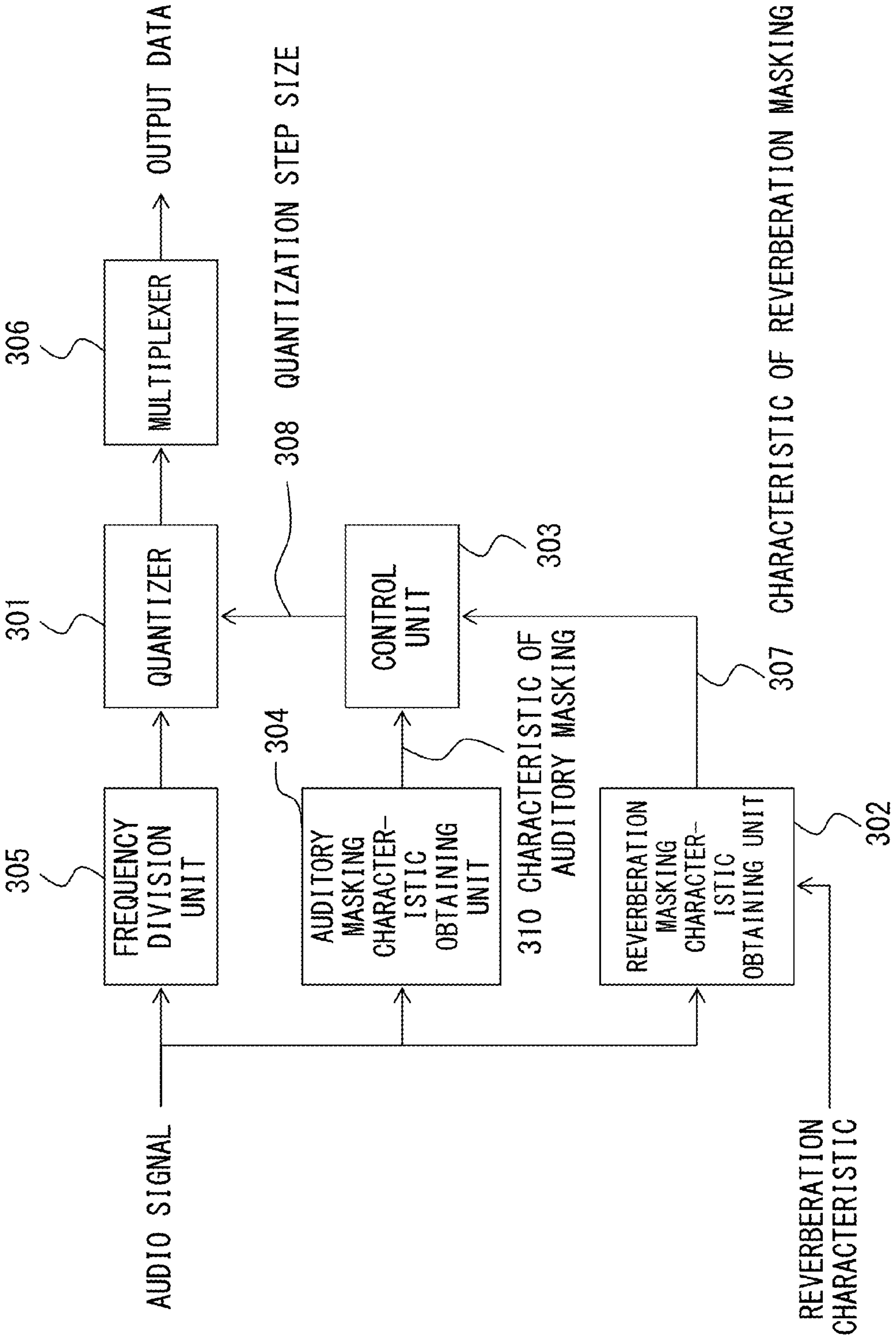
FIG. 3 is a block diagram of an encoding apparatus of a first embodiment.

FIG. 3 is a block diagram of an encoding apparatus of a first embodiment.

In FIG. 3, a quantizer 301 quantizes an audio signal. More specifically, a frequency division unit 305 divides the audio signal into sub-band signals in a plurality of frequency bands, the quantizer 301 quantizes the plurality of sub-band signals individually, and a multiplexer 306 further multiplexes the plurality of sub-band signals quantized by the quantizer 301.

Next, in FIG. 3, a reverberation masking characteristic obtaining unit 302 obtains a characteristic 307 of reverberation masking that is exerted on a sound represented by the audio signal by reverberation of the sound generated in a reproduction environment by reproducing the sound. For example, the reverberation masking characteristic obtaining unit 302 obtains a characteristic of frequency masking that reverberation exerts on the sound, as the characteristic 307 of the reverberation masking. Alternatively, for example, the reverberation masking characteristic obtaining unit 302 obtains a characteristic of temporal masking that reverberation exerts on the sound, as the characteristic 307 of the reverberation masking. Further, the reverberation masking characteristic obtaining unit 302 calculates, for example, the characteristic 307 of the reverberation masking by using the audio signal, a reverberation characteristic 309 of the reproduction environment, and a human auditory psychology model prepared in advance. In this process, the reverberation masking characteristic obtaining unit 302 calculates, for example, the characteristic 307 of the reverberation masking as the reverberation characteristic 309 by using a reverberation characteristic selected from among reverberation characteristics prepared for respective reproduction environments in advance. In this process, the reverberation masking characteristic obtaining unit 302 further receives selection information on the reverberation characteristic corresponding to the reproduction environment to select the reverberation characteristic 309 corresponding to the reproduction environment. Alternatively, the reverberation masking characteristic obtaining unit 302 receives, for example, a reverberation characteristic that is an estimation result of the reverberation characteristic in the reproduction environment based on a sound picked up in the reproduction environment and a sound emitted in the reproduction environment when the picked-up sound is picked up, as the reverberation characteristic 309, to calculate the characteristic 307 of the reverberation masking.

In FIG. 3, a control unit 303 controls a quantization step size 308 of the quantizer 301 based on the characteristic 307 of the reverberation masking. For example, the control unit 303 performs control, based on the characteristic 307 of the reverberation masking, so as to make the quantization step size 308 larger in the case where the magnitude of a sound represented by the audio signal is such that the sound is masked by the reverberation, as compared with the case where the magnitude is such that the sound is not masked by the reverberation.

In addition to the above configuration, the auditory masking characteristic obtaining unit 304 further obtains a characteristic of auditory masking that the human auditory characteristic exerts on a sound represented by the audio signal. Then, the control unit 303 further controls the quantization step size 308 of the quantizer 301 based also on the characteristic of the auditory masking. More specifically, the reverberation masking characteristic obtaining unit 302 obtains a frequency characteristic of the magnitude of a sound masked by the reverberation, as the characteristic 307 of the reverberation masking, and the auditory masking characteristic obtaining unit 304 obtains a frequency characteristic of the magnitude of a sound masked by the human auditory characteristic, as a characteristic 310 of the auditory masking. Then, the control unit 303 controls the quantization step size 308 of the quantizer 301 based on a composite masking characteristic obtained by selecting, for each frequency, a greater characteristic from between the frequency characteristic of the characteristic 307 of the reverberation masking and the frequency characteristic of the characteristic 310 of the auditory masking.

Figure 4:
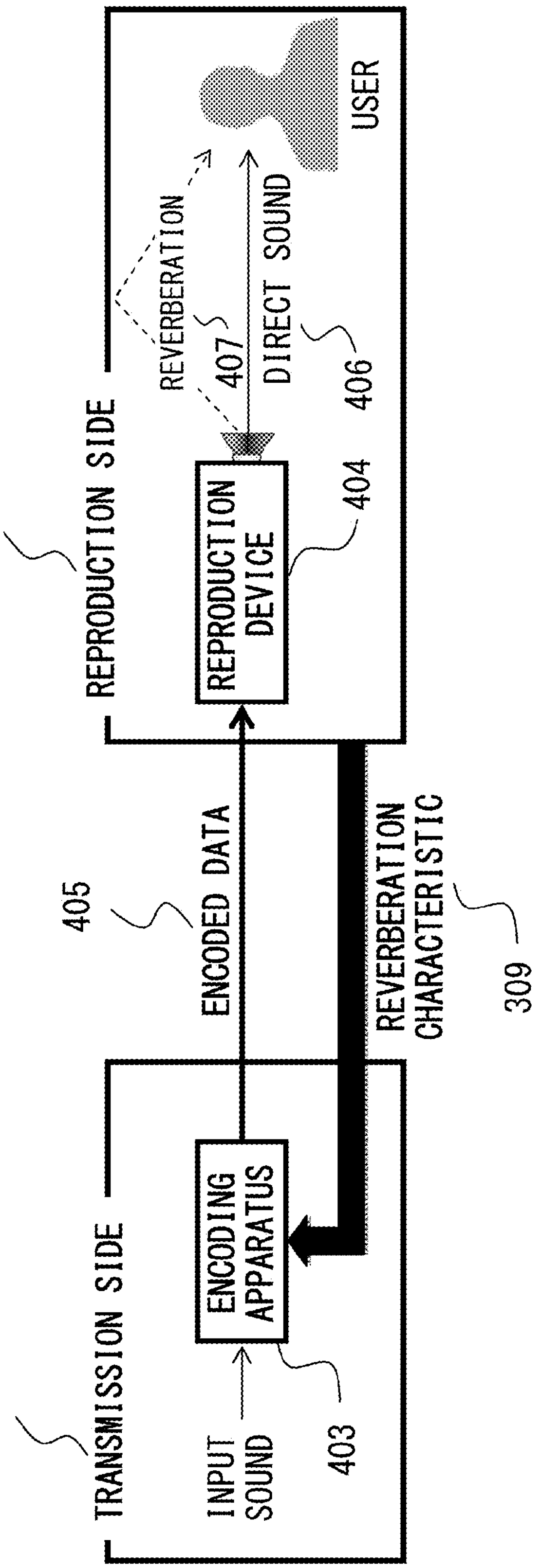
FIG. 4 is an explanatory diagram illustrating a reverberation characteristic 309 in the encoding apparatus of the first embodiment having the configuration of FIG. 3.

FIG. 4 is an explanatory diagram illustrating the reverberation characteristic 309 in the encoding apparatus of the first embodiment having the configuration of FIG. 3.

On a transmission side 401, an encoding apparatus 403 encodes an input sound (corresponding to the audio signal of FIG. 1), resulting encoded data 405 (corresponding to the output data of FIG. 1) is transmitted to a reproduction device 404 on a reproduction side 402, and the reproduction device 404 decodes and reproduces the encoded data. Here, in a reproduction environment where the reproduction device 404 emits a sound to a user through a loud speaker, reverberation 407 is typically generated in addition to a direct sound 406.

In the first embodiment, a characteristic of the reverberation 407 in the reproduction environment are provided to the encoding apparatus 403 having the configuration of FIG. 3, as the reverberation characteristic 309. In the encoding apparatus 403 having the configuration of FIG. 3, the control unit 303 controls the quantization step size 308 of the quantizer 301 based on the characteristic 307 of the reverberation masking obtained by the reverberation masking characteristic obtaining unit 302 based on the reverberation characteristic 309. More specifically, the control unit 303 generates a composite masking characteristic obtained by selecting, for each frequency, a greater characteristic from between the frequency characteristic of the characteristic 307 of the reverberation masking and the frequency characteristic of the characteristic 310 of the auditory masking obtained by the auditory masking characteristic obtaining unit 304. The control unit 303 controls the quantization step size 308 of the quantizer 301 based on the composite masking characteristic. In such a manner, the encoding apparatus 403 performs control of outputting the encoded data 405 such that frequencies buried in the reverberation are not encoded as much as possible.

Figure 5A:
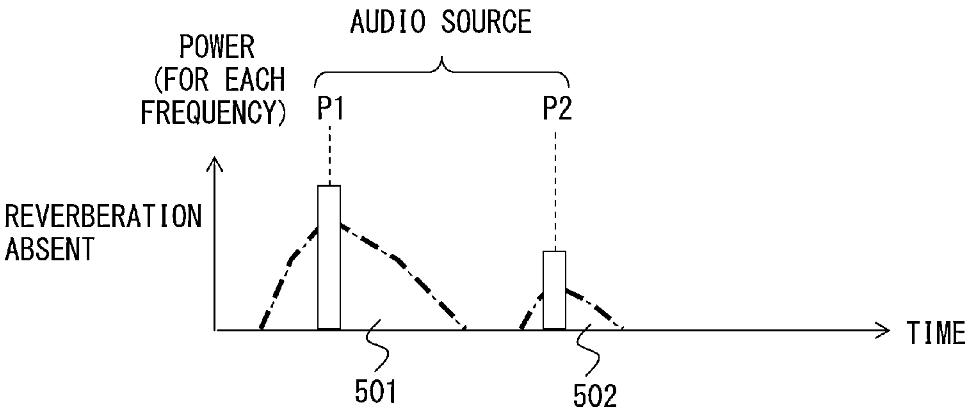
FIG. 5A and FIG. 5B are explanatory diagrams illustrating an encoding operation of the encoding apparatus of FIG. 3 in the absence of reverberation and in the presence of reverberation.
Figure 5B:
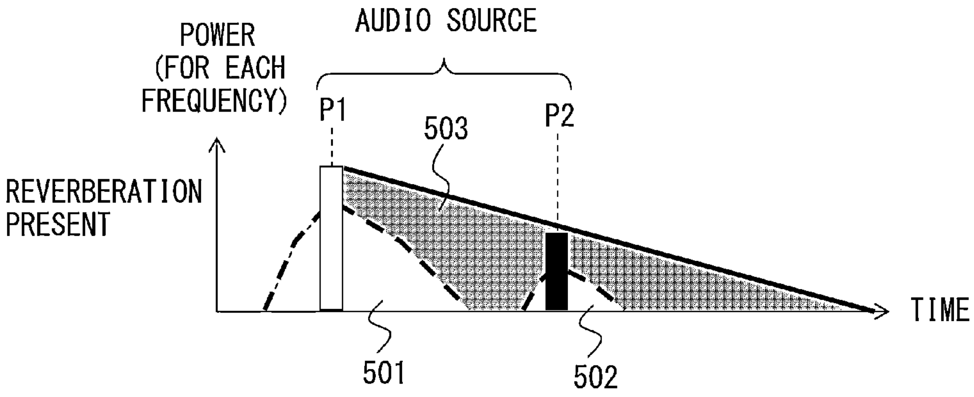

FIG. 5A and FIG. 5B are explanatory diagrams illustrating an encoding operation of the encoding apparatus of FIG. 3 in the absence of reverberation and in the presence of reverberation.

In the case where the reverberation is absent, as illustrated in FIG. 5A, and an audio signal includes two audio sources P1 and P2, for example, a range of the auditory masking is composed of ranges indicated by reference numerals 501 and 502 corresponding to the respective audio sources P1 and P2. In this case, since both of the power values of the audio sources P1 and P2 exceed the range of the auditory masking, the control unit 303 of FIG. 3 needs to assign a fine value as the quantization step size 308 to each of the frequency signal components corresponding to the respective audio sources P1 and P2 based on the characteristic of the auditory masking.

On the other hand, in the presence of the reverberation, as described in FIG. 4, the user is influenced by the reverberation 407 in addition to the direct sound 406, therefore receiving the reverberation masking in addition to the auditory masking.

Accordingly, the control unit 303 of FIG. 3 controls the quantization step size 308 for each frequency signal component taking into consideration a range 503 of the reverberation masking based on the characteristic 307 of the reverberation masking besides the ranges 501 and 502 of the auditory masking based on the characteristic 310 of the auditory masking. Specifically, consider a case where the reverberation is present, as illustrated in FIG. 5B, and the range 503 of the reverberation masking entirely includes the ranges 501 and 502 of the auditory masking, that is, the case where the reverberation 407 is significantly large in the reproduction environment, as illustrated in FIG. 4. Further consider a case, with respect to the frequency signal component of the audio source P2, where the power value of the range 503 of the reverberation masking is greater than the power values of the ranges 501 and 502 of the auditory masking, and the power value of the audio source P2 is within the range 503 of the reverberation masking. In this case, the control unit 303 of FIG. 3 makes the quantization step size 308 for the frequency signal component corresponding to the audio source P2 coarse based on the characteristic 310 of the auditory masking and the characteristic 307 of the reverberation masking.

As a result, in the case where the characteristic 307 of the reverberation masking is greater than the characteristic 310 of the auditory masking, encoding is performed such that frequencies buried in the reverberation are not encoded as much as possible. In such a manner, the encoding apparatus of the first embodiment of FIG. 3 encodes only an acoustic component that is not masked by the reverberation, enabling the enhancement of the encoding efficiency as compared with the encoding apparatus having the common configuration that performs control based on only a characteristic of the auditory masking, as described in FIG. 1. This enables the improvement of the sound quality at the low-bit-rate.

According to an experiment, on the condition that the input sound is a speech sound, and the reproduction environment is an interior or the like in which the reverberation is large, the proportion of masked frequency bands to all frequency bands of the input sound accounted for about 7% when only the auditory masking was taken into consideration, whereas the proportion accounted for about 24% when the reverberation masking was also taken into consideration. Thus, under the aforementioned condition, the encoding efficiency of the encoding apparatus of the first embodiment is about three times greater than that of the encoding apparatus in which only the auditory masking is taken into consideration.

According to the first embodiment, an even lower bit rate is achieved. Specially, there is provided an advantage of lowering a bit rate requested to achieve the same S/N in the presence of the reverberation. According to the first embodiment, a reverberation component is not actively encoded and added on the reproduction side, but a portion buried in the reverberation generated on the reproduction side will not be encoded.

Figure 6:
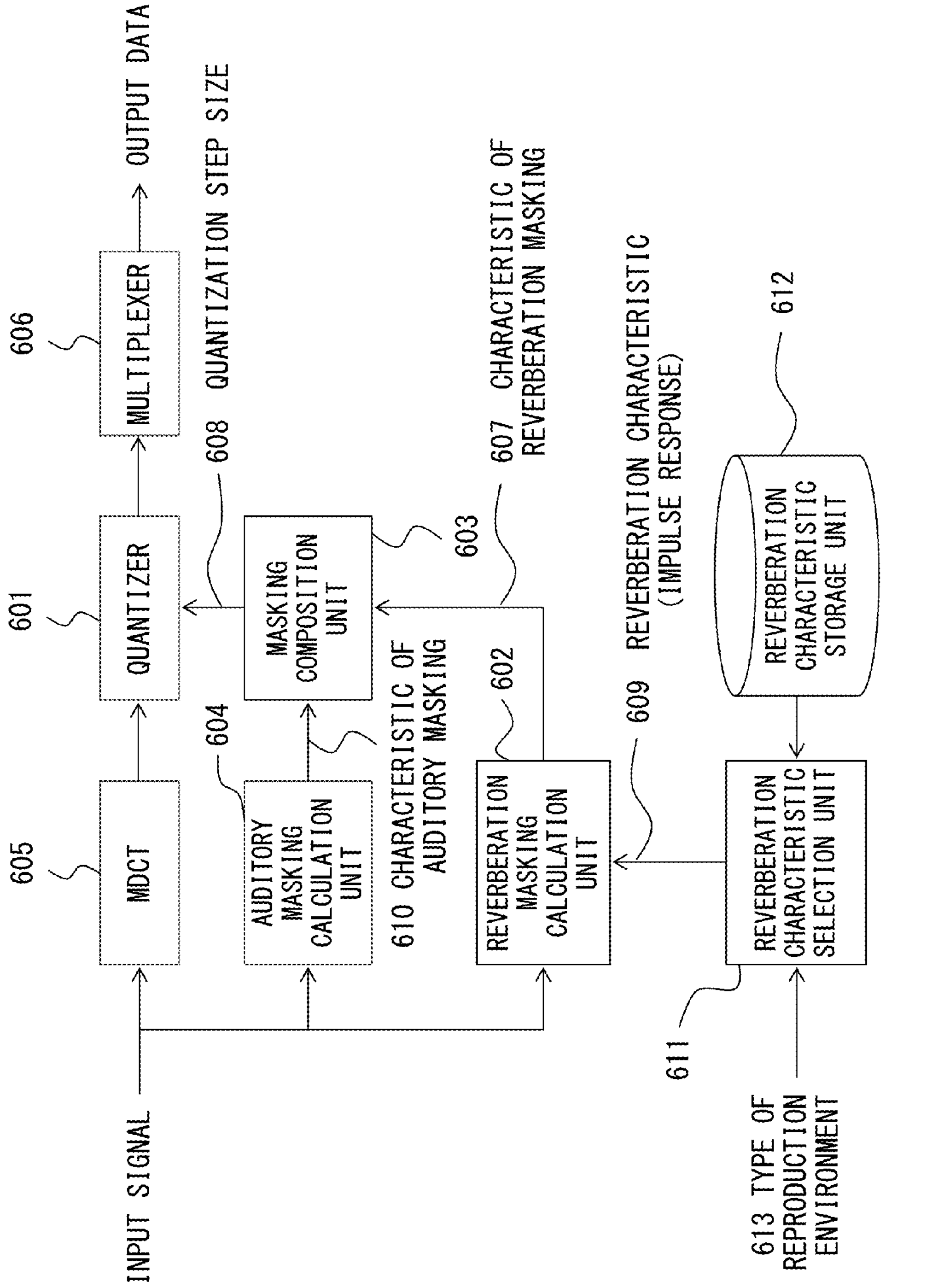
FIG. 6 is a block diagram of an audio signal encoding apparatus of a second embodiment.

FIG. 6 is a block diagram of an audio signal encoding apparatus of the second embodiment. The audio signal encoding apparatus selects a reverberation characteristic of a reproduction environment based on an input type of the reproduction environment (a large room, a small room, a bathroom, or the like), and enhances the encoding efficiency of an input signal by making use of the reverberation masking. The configuration of the second embodiment may by applicable to, for example, an LSI (Large-Scale Integrated circuit) for a multimedia broadcast apparatus.

In FIG. 6, a Modified Discrete Cosine Transform (MDCT) unit 605 divides an input signal (corresponding to the audio signal of FIG. 3) into frequency signal components in units of frame of a given length of time. MDCT is a Lapped Orthogonal Transform in which frequency conversion is performed while window data for segmentation of an input signal in units of frame is overlapped by half of length of the window data, which is a known frequency division method for reducing the amount of converted data by receiving a plurality of input signals and outputting a coefficient set of frequency signal components of which the number is equal to a half of the number of the input signals.

The reverberation characteristic storage unit 612 (corresponding to part of the reverberation masking characteristic obtaining unit 302 of FIG. 3) stores a plurality of reverberation characteristics corresponding to the types of the plurality of reproduction environments. The reverberation characteristic is an impulse response of the reverberation (corresponding to the reference numeral 407 of FIG. 4) in the reproduction environment.

A reverberation characteristic selection unit 611 (corresponding to part of the reverberation masking characteristic obtaining unit 302 of FIG. 3) reads out a reverberation characteristic 609 corresponding to a type 613 of the reproduction environment that is input, from the reverberation characteristic storage unit 612. Then, the reverberation characteristic selection unit 611 gives the reverberation characteristic 609 to a reverberation masking calculation unit 602 (corresponding to part of the reverberation masking characteristic obtaining unit 302 of FIG. 3).

The reverberation masking calculation unit 602 calculates characteristic 607 of the reverberation masking by using the input signal, the reverberation characteristic 609 of the reproduction environment, and the human auditory psychology model prepared in advance.

An auditory masking calculation unit 604 (corresponding to the auditory masking characteristic obtaining unit 304 of FIG. 3) calculates a characteristic 610 of the auditory masking being an auditory masking threshold value (forward direction and backward direction masking), from the input signal. The auditory masking calculation unit 604 includes, for example, a spectrum calculation unit for receiving a plurality of frames of a given length as the input signal and performing frequency analysis for each frame. The auditory masking calculation unit 604 further includes a masking curve prediction unit for calculating a masking curve being the characteristic 610 of the auditory masking with taking into consideration the calculation result from the spectrum calculation unit and a masking effect being the human auditory characteristic (for example, see the description of Japanese Patent Laid-Open No. 9-321628).

A masking composition unit 603 (corresponding to the control unit 303 of FIG. 3) controls a quantization step size 608 of a quantizer 601 based on a composite masking characteristic obtained by selecting, for each frequency, a greater characteristic from between the frequency characteristic of the characteristic 607 of the reverberation masking and the frequency characteristic of the characteristic 610 of the auditory masking.

The quantizer 601 quantizes sub-band signals in a plurality of frequency bands output from the MDCT unit 605 at quantization bit count corresponding to the quantization step sizes 608 that are input from the masking composition unit 603 in accordance with respective frequency bands. Specifically, when the frequency component of the input signal is greater than a threshold value of the composite masking characteristic, the quantization bit count is increased (the quantization step size is made fine), and when the frequency component of the input signal is smaller than the threshold value of the composite masking characteristic, the quantization bit count is decreased (the quantization step size is made coarse).

A multiplexer 606 multiplexes pieces of data on sub-band signals of the plurality of frequency components quantized by the quantizer 601 into an encoded bit stream.

An operation of the audio signal encoding apparatus of the second embodiment of FIG. 6 will be described below.

First, a plurality of reverberation characteristics (impulse responses) are stored in the reverberation characteristic storage unit 612 of FIG. 6 in advance. FIG. 7 is a diagram illustrating a configuration example of data stored in the reverberation characteristic storage unit 612. The reverberation characteristics are stored in associated with the types of reproduction environments, respectively. As the reverberation characteristics, measurement results of typical interior impulse responses corresponding to the types of the reproduction environments are used.

The reverberation characteristic selection unit 611 of FIG. 6 obtains the type 613 of the reproduction environment. For example, a type selection button is provided in the encoding apparatus, with which a user selects a type in accordance with the reproduction environment in advance. The reverberation characteristic selection unit 611 refers to the reverberation characteristic storage unit 612 to output the reverberation characteristic 609 corresponding to the obtained type 613 of the reproduction environment.

Figure 8:
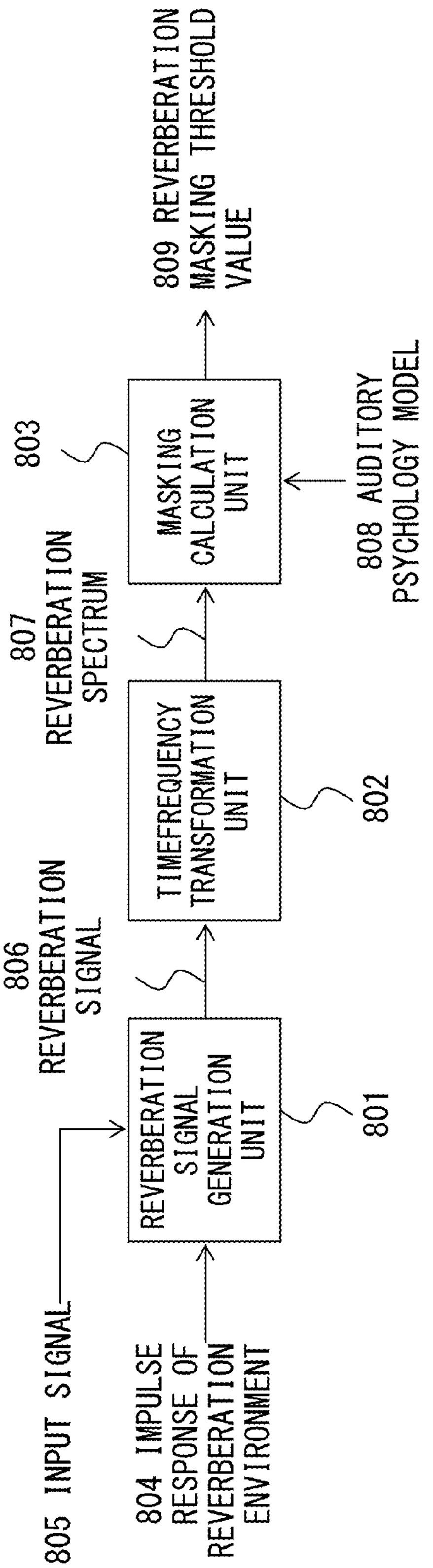
FIG. 8 is a block diagram of a reverberation masking calculation unit 602 of FIG. 6.

FIG. 8 is a block diagram of the reverberation masking calculation unit 602 of FIG. 6.

A reverberation signal generation unit 801 is a known FIR (Finite Impulse Response) filter for generating a reverberation signal 806 from an input signal 805 by using an impulse response 804 of the reverberation environment being the reverberation characteristic 609 output from the reverberation characteristic selection unit 611 of FIG. 6, based on Expression 1 below.

$$r(t) = h_2(t) * x(t) \quad \text{[Expression 1]}$$

$$h_2(t) = \begin{cases} h(t) & : t \geq TH \\ 0 & : t < TH \end{cases}$$

In the above Expression 1, x(t) denotes the input signal 805, r(t) denotes the reverberation signal 806, h(t) denotes the impulse response 804 of the reverberation environment, and TH denotes a starting point in time of the reverberation (for example, 100 ms).

A time-frequency transformation unit 802 calculates a reverberation spectrum 807 corresponding to the reverberation signal 806. Specifically, the time-frequency transformation unit 802 performs Fast Fourier Transform (FFT) calculation or Discrete Cosine Transform (DCT) calculation, for example. When the FFT calculation is performed, an arithmetic operation of Expression 2 below is performed.

$$R(j) = \sum_{t=0}^{n-1} r(t) e^{-\frac{2\pi i}{n} jt} \quad \text{[Expression 2]}$$

In the above Expression 2, r(t) denotes the reverberation signal 806, R(j) denotes the reverberation spectrum 807, n denotes the length of an analyzing discrete time for the reverberation signal 806 on which the FFT is performed (for example, 512 points), and j denotes a frequency bin (a signaling point on a frequency axis).

A masking calculation unit 803 calculates a masking threshold value from the reverberation spectrum 807 by using an auditory psychology model 808, and outputs the masking threshold value as a reverberation masking threshold value 809. In FIG. 6, the reverberation masking threshold value 809 is provided as the characteristic 607 of the reverberation masking, from the reverberation masking calculation unit 602 to the masking composition unit 603.

Figure 9A:
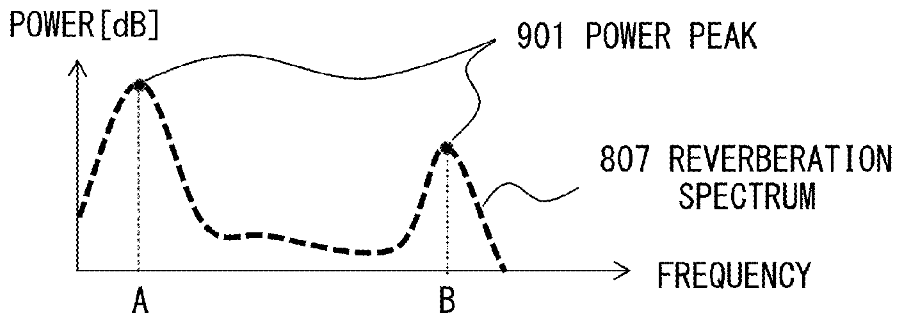
FIG. 9A, FIG. 9B, and FIG. 9C are explanatory diagrams illustrating an example of masking calculation in the case of using frequency masking that reverberation exerts on the sound as a characteristic of reverberation masking.
Figure 9B:
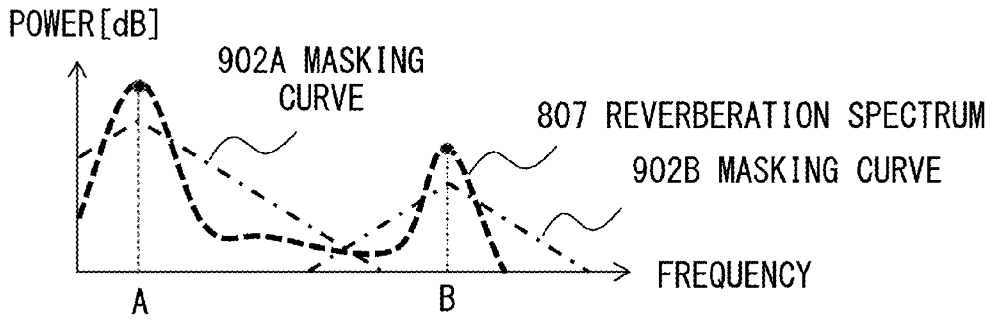
Figure 9C:
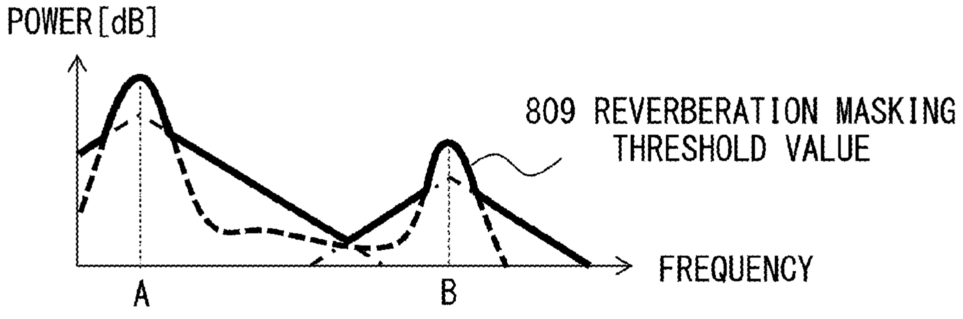

FIG. 9 A, FIG. 9B, and FIG. 9C are explanatory diagrams illustrating an example of masking calculation in the case of using a frequency masking that reverberation exerts on the sound as the characteristic 607 of the reverberation masking of FIG. 6. In FIG. 9A, FIG. 9B, or FIG. 9C, a transverse axis denotes frequency of the reverberation spectrum 807, and a vertical axis denotes the power (db) of each reverberation spectrum 807.

First, the masking calculation unit 803 of FIG. 8 estimates a power peak 901 in a characteristic of the reverberation spectrum 807 illustrated as a dashed characteristic curve in FIG. 9. In FIG. 9A, two power peaks 901 are estimated. Frequencies of these two power peaks 901 are defined as A and B, respectively.

Next, the masking calculation unit 803 of FIG. 8 calculates a masking threshold value based on the power peaks 901. A frequency masking model is known in which the determination of the frequencies A and B of the power peaks 901 leads to the determination of masking ranges, for example, the amount of frequency masking described in the literature "Choukaku to Onkyousinri (Auditory Sense and Psychoacoustics)" (in Japanese), CORONA PUBLISHING CO., LTD., p. 111-112 can be used. Based on the auditory psychology model 808, the following characteristics can be generally observed. With regard to the power peaks 901 illustrated in FIG. 9A, when a frequency is as low as the power peak 901 at the frequency A of FIG. 9A, for example, a slope of a masking curve 902A having a peak at the power peak 901 and descending toward the both side of the peak is steep. As a result, a frequency range masked around the frequency A is small. On the other hand, when a frequency is as high as the power peak 901 at the frequency B of FIG. 9A, for example, a slope of a masking curve 902B having a peak at the power peak 901 and descending toward the both side of the peak is gentle. As a result, a frequency range masked around the frequency B is large. The masking calculation unit 803 receives such a frequency characteristic as the auditory psychology model 808, and calculates masking curves 902A and 902B as illustrated by triangle characteristics of alternate long and short dash lines of FIG. 9B, for example, in logarithmic values (decibel values) in a frequency direction, for the power peaks 901 at the frequencies A and B, respectively.

Finally, the masking calculation unit 803 of FIG. 8 selects a maximum value from among the characteristic curve of the reverberation spectrum 807 of FIG. 9A and the masking curves 902A and 902B of the masking threshold values of FIG. 9B, for each frequency bin. In such a manner, the masking calculation unit 803 integrates the masking threshold values to output the integration result as the reverberation masking threshold value 809. In the example of FIG. 9C, the reverberation masking threshold value 809 is obtained as the characteristic curve of a thick solid line.

Figure 10A:
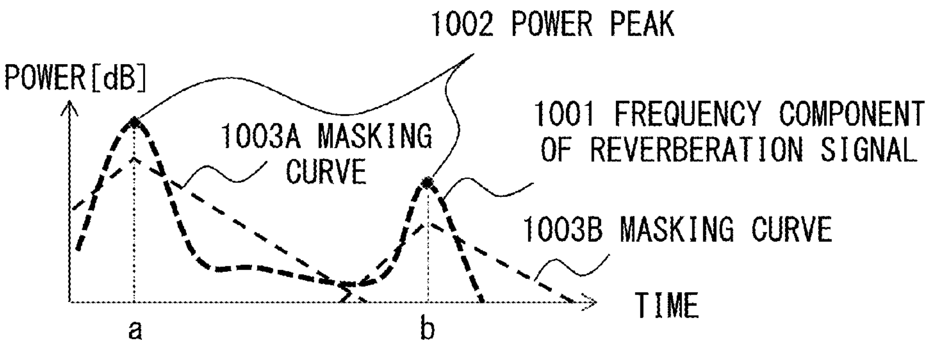
FIG. 10A and FIG. 10B are explanatory diagrams illustrating an example of masking calculation in the case of using temporal masking that reverberation exerts on the sound as the characteristic of the reverberation masking.
Figure 10B:
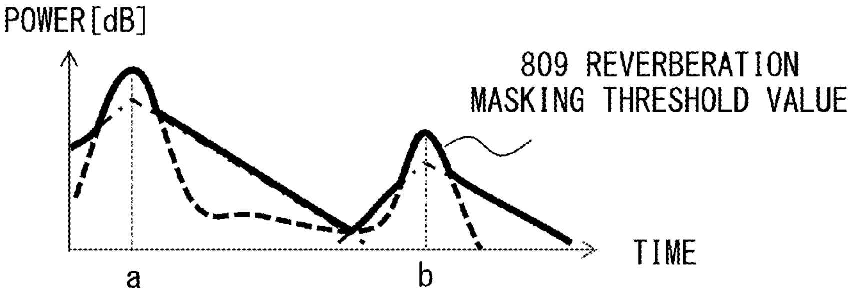

FIG. 10A and FIG. 10B are explanatory diagrams illustrating an example of masking calculation in the case of using temporal masking that the reverberation exerts on the sound as the characteristic 607 of the reverberation masking of FIG. 6. In FIG. 10A or FIG. 10B, a transverse axis denotes time, and a vertical axis denotes power (db) of the frequency signal component of the reverberation signal 806 in each frequency band (frequency bin) at each point in time. Each of FIG. 10A and FIG. 10B illustrates temporal changes in a frequency signal component in any one of the frequency bands (frequency bins) output from the time-frequency transformation unit 802 of FIG. 8.

First, the masking calculation unit 803 of FIG. 8 estimates a power peak 1002 in a time axis direction with respect to temporal changes in a frequency signal component 1001 of the reverberation signal 806 in each frequency band. In FIG. 10A, two power peaks 1002 are estimated. Points in time of these two power peaks 1002 are defined as a and b.

Next, the masking calculation unit 803 of FIG. 8 calculates a masking threshold value based on each power peaks 1002. The determination of the points in time a and b of the power peaks 1002 can lead to the determination of masking ranges in a forward direction (a time direction following the respective points in time a and b) and in a backward direction (a time direction preceding the respective points in time a and b) across the respective points in time a and b as boundaries. As a result, the masking calculation unit 803 calculates masking curves 1003A and 1003B as illustrated by triangle characteristics of alternate long and short dash lines of FIG. 10A, for example, in logarithmic values (decibel values) in a time direction, for the power peaks 1002 at the respective points in time a and b. Each masking range in the forward direction generally extends to the vicinity of about 100 ms after the point in time of the power peak 1002, and each masking range in the backward direction generally extends to the vicinity of about 20 ms before the point in time of the power peak 1002. The masking calculation unit 803 receives the above temporal characteristic in the forward direction and the backward direction as the auditory psychology model 808, for each of the power peaks 1002 at the respective points in time a and b. The masking calculation unit 803 calculates, based on the temporal characteristic, a masking curve in which the amount of masking decreases exponentially as the point in time is away from the power peak 1002 in the forward direction and the backward direction.

Finally, the masking calculation unit 803 of FIG. 8 selects the maximum value from among the frequency signal component 1001 of the reverberation signal of FIG. 10A and the masking curves 1003A and 1003B of the masking threshold values of FIG. 10A for each discrete time and for each frequency band. In such a manner, the masking calculation unit 803 integrates the masking threshold values for each frequency band, and outputs the integration result as the reverberation masking threshold value 809 in the frequency band. In the example of FIG. 10B, the reverberation masking threshold value 809 is obtained as the characteristic curve of a thick solid line.

Two methods have been described above as specific examples of the characteristic 607 (the reverberation masking threshold value 809) of the reverberation masking output by the reverberation masking calculation unit 602 of FIG. 6 having the configuration of FIG. 8. One is a method of the frequency masking (FIG. 9) in which masking in the frequency direction is done centered about the power peak 901 on the reverberation spectrum 807. The other is a method of the temporal masking (FIG. 10) in which masking in the forward direction and the backward direction is done centered about the power peak 1002 of each frequency signal component of the reverberation signal 806 in the time axis direction.

Either or both of the masking methods may be applied for obtaining the characteristic 607 (the reverberation masking threshold value 809) of the reverberation masking.

Figure 11:
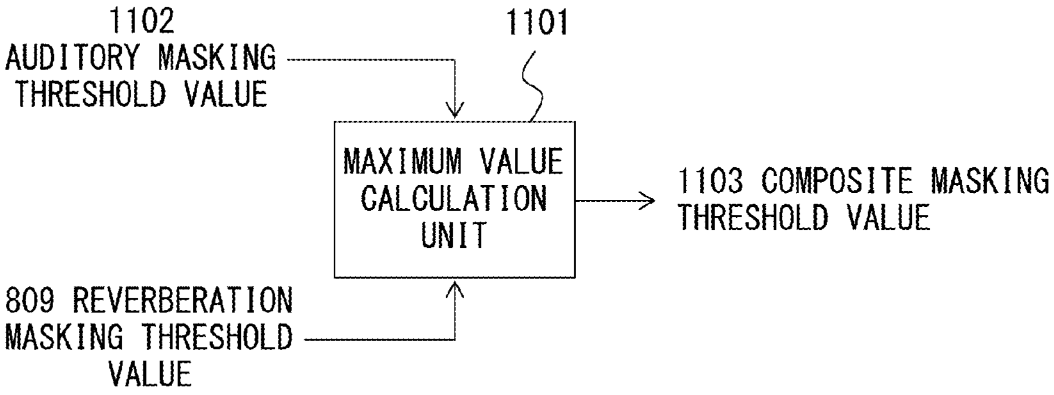
FIG. 11 is a block diagram of a masking composition unit 603 of FIG. 6.

FIG. 11 is a block diagram of the masking composition unit 603 of FIG. 6. The masking composition unit 603 includes a maximum value calculation unit 1101. The maximum value calculation unit 1101 receives the reverberation masking threshold value 809 (see FIG. 8) from the reverberation masking calculation unit 602 of FIG. 6, as the characteristic 607 of the reverberation masking. The maximum value calculation unit 1101 further receives an auditory masking threshold value 1102 from the auditory masking calculation unit 604 of FIG. 6, as the characteristic 610 of the auditory masking. Then, the maximum value calculation unit 1101 selects a greater power value from between the reverberation masking threshold value 809 and the auditory masking threshold value 1102, for each frequency band (frequency bin), and calculates a composite masking threshold value 1103 (a composite masking characteristic).

Figure 12A:
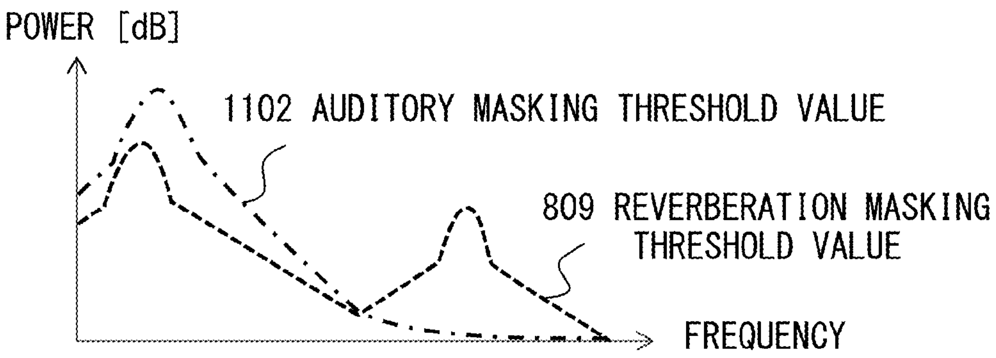
FIG. 12A and FIG. 12B are operation explanatory diagrams of a maximum value calculation unit 1101.
Figure 12B:
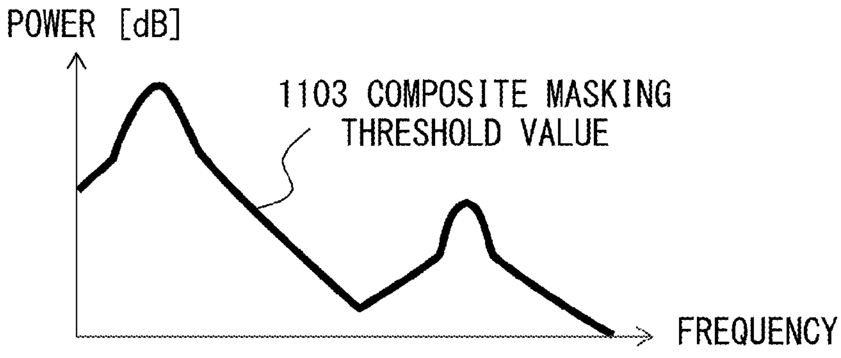

FIG. 12A and FIG. 12B is an operation explanatory diagram of the maximum value calculation unit 1101. In FIG. 12A, power values are compared between the reverberation masking threshold value 809 and the auditory masking threshold value 1102, for each frequency band (frequency bin) on a frequency axis. As a result, as illustrated in FIG. 12B, the maximum value is calculated as the composite masking threshold value 1103.

Note that, instead of the maximum value of the power values of the reverberation masking threshold value 809 and the auditory masking threshold value 1102, the result of summing logarithmic power values (decibel values) of the reverberation masking threshold value 809 and the auditory masking threshold value 1102 each of which is weighted in accordance with the phase thereof may be calculated as the composite masking threshold value 1103, for each frequency band (frequency bin).

In such a manner, according to the second embodiment, the unhearable frequency range can be calculated that is masked by both the input signal and the reverberation, and using the composite masking threshold value 1103 (the composite masking characteristic) enables even more efficient encoding.

Figure 13:
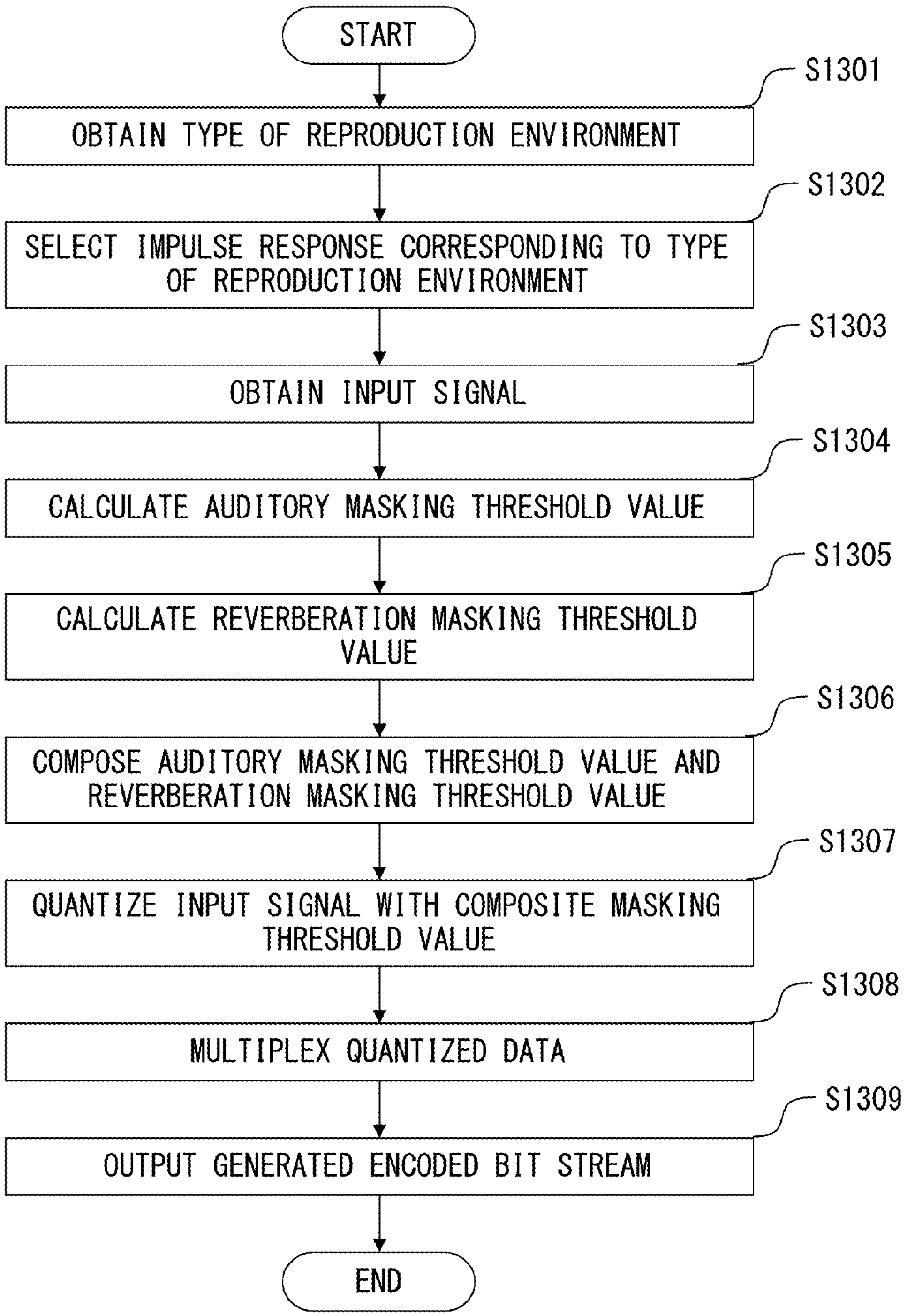
FIG. 13 is a flowchart illustrating a control operation of a device that implements, by means of a software process, the function of the audio signal encoding apparatus of the second embodiment having the configuration of FIG. 6.

FIG. 13 is a flowchart illustrating a control operation of a device that implements, by means of a software process, the function of the audio signal encoding apparatus of the second embodiment having the configuration of FIG. 6. The control operation is implemented as an operation in which a processor (not specially illustrated) that implements an audio signal encoding apparatus executes a control program stored in a memory (not specially illustrated).

First, the type 613 (FIG. 6) of the reproduction environment that is input is obtained (step S1301).

Next, the impulse response of the reverberation characteristic 609 corresponding to the input type 613 of the reproduction environment is selected and read out from the reverberation characteristic storage unit 612 of FIG. 6 (step S1302).

The above processes of the steps S1301 and S1302 correspond to the reverberation characteristic selection unit 611 of FIG. 6.

Next, the input signal is obtained (step S1303).

Then, the auditory masking threshold value 1102 (FIG. 11) is calculated (step S1304).

The above processes of the steps S1303 and S1304 correspond to the auditory masking calculation unit 604 of FIG. 6.

Further, the reverberation masking threshold value 809 (FIG. 8) is calculated by using the impulse response of the reverberation characteristic 609 obtained in the step S1302, the input signal obtained in the step S1303, and the human auditory psychology model prepared in advance (step S1305). The calculation process in this step is similar to that explained with FIG. 8 to FIG. 10.

The above processes of the steps S1303 and S1305 correspond to the reverberation masking calculation unit 602 in FIG. 6 and FIG. 8.

Next, the auditory masking threshold value 1102 and the reverberation masking threshold value 809 are composed to calculate the composite masking threshold value 1103 (FIG. 11) (step S1306). The composite process in this step is similar to that explained with FIG. 11 and FIG. 12.

The process of the step S1306 corresponds to the masking composition unit 603 of FIG. 6.

Next, the input signal is quantized with the composite masking threshold value 1103 (step S1307). Specifically, when the frequency component of the input signal is greater than the composite masking threshold value 1103, the quantization bit count is increased (the quantization step size is made fine), and when the frequency component of the input signal is smaller than a threshold value of the composite masking characteristic, the quantization bit count is decreased (the quantization step size is made coarse).

The process of the step S1307 corresponds to the function of part of the masking composition unit 603 and the quantizer 601 of FIG. 6.

Next, pieces of data on the sub-band signals of the plurality of frequency components quantized in the step S1307 are multiplexed into an encoded bit stream (step S1308).

Then, the generated encoded bit stream is output (step S1309).

The above processes of the steps S1308 and S1309 correspond to the multiplexer 606 of FIG. 6.

According to the second embodiment, similar to the first embodiment, an even lower bit rate is enabled. Moreover, by causing the reverberation characteristic storage unit 612 in the audio signal encoding apparatus to store the reverberation characteristic 609, the characteristic 607 of the reverberation masking can be obtained only by specifying the type 613 of the reproduction environment, without providing the reverberation characteristic to the encoding apparatus 1401 from the outside.

Figure 14:
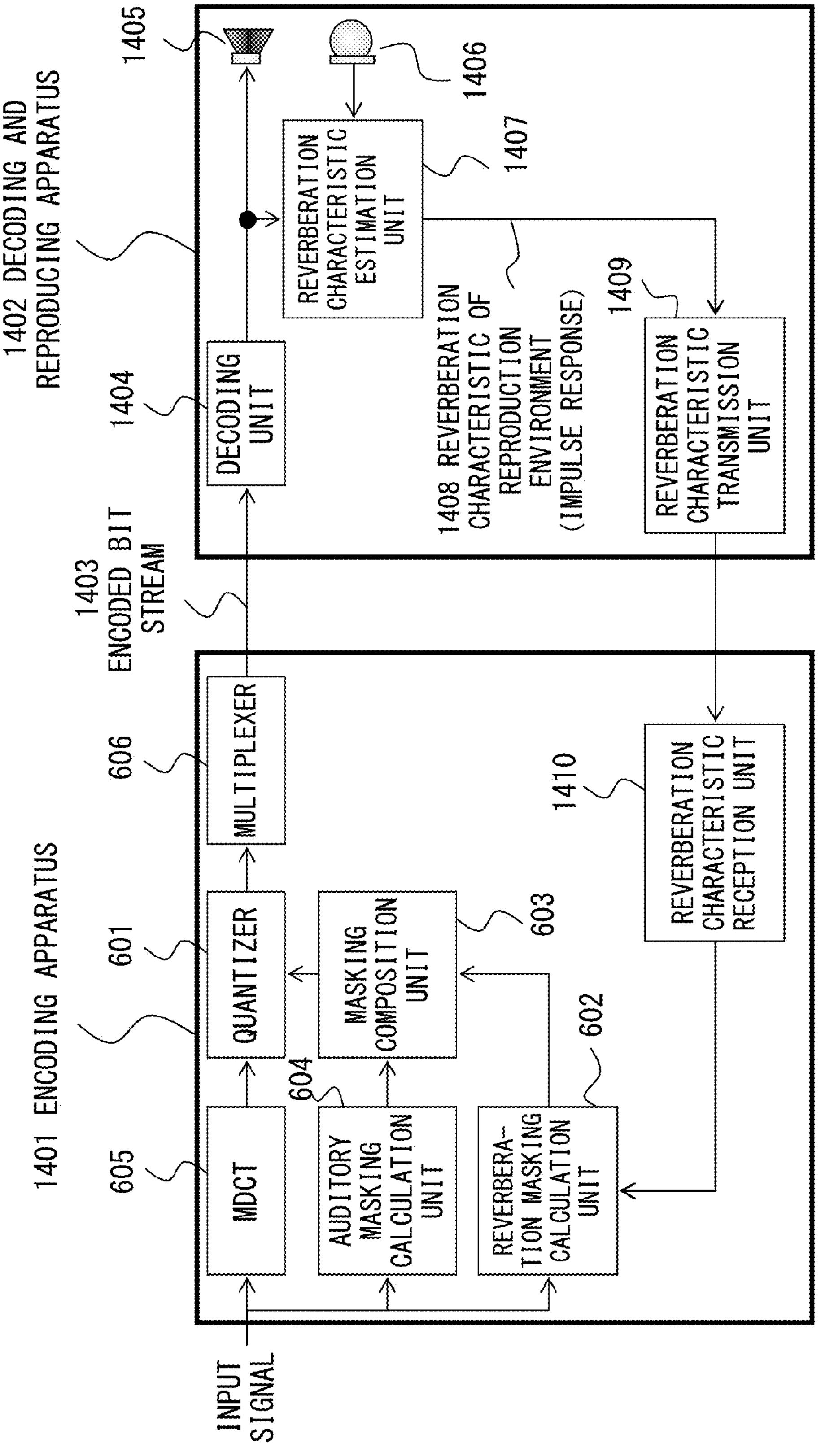
FIG. 14 is a block diagram of an audio signal transmission system of a third embodiment.

FIG. 14 is a block diagram of an audio signal transmission system of a third embodiment.

The system estimates a reverberation characteristic 1408 of the reproduction environment in a decoding and reproducing apparatus 1402, and notifies the reverberation characteristic 1408 to an encoding apparatus 1401 to enhance the encoding efficiency of an input signal by making use of reverberation masking. The system may be applicable to, for example, a multimedia broadcast apparatus and a reception terminal.

To begin with, configurations and functions of the quantizer 601, the reverberation masking calculation unit 602, the masking composition unit 603, the auditory masking calculation unit 604, the MDCT unit 605, and multiplexer 606 that constitute the encoding apparatus 1401 are similar to those illustrated in FIG. 6 according to the second embodiment.

An encoded bit stream 1403 output from the multiplexer 606 in the encoding apparatus 1401 is received by a decoding unit 1404 in the decoding and reproducing apparatus 1402.

The decoding unit 1404 decodes a quantized audio signal (an input signal), that is transmitted from the encoding apparatus 1401 as the encoded bit stream 1403. As a decoding scheme, for example, an AAC (Advanced Audio Coding) scheme can be employed.

A sound emission unit 1405 emits a sound including a sound of the decoded audio signal in the reproduction environment. Specifically, the sound emission unit 1405 includes, for example, an amplifier for amplifying the audio signal, and a loud speaker for emitting a sound of the amplified audio signal.

A sound pickup unit 1406 picks up a sound emitted by the sound emission unit 1405, in the reproduction environment. Specifically, the sound pickup unit 1406 includes, for example, a microphone for picking up the emitted sound, and an amplifier for amplifying an audio signal output from the microphone, and an analog-to-digital converter for converting the audio signal output from the amplifier into a digital signal.

A reverberation characteristic estimation unit (an estimation unit) 1407 estimates the reverberation characteristic 1408 of the reproduction environment based on the sound picked up by the sound pickup unit 1406 and the sound emitted by the sound emission unit 1405. The reverberation characteristic 1408 of the reproduction environment is, for example, an impulse response of the reverberation (corresponding to the reference numeral 407 of FIG. 4) in the reproduction environment.

A reverberation characteristic transmission unit 1409 transmits the reverberation characteristic 1408 of the reproduction environment estimated by the reverberation characteristic estimation unit 1407 to the encoding apparatus 1401.

On the other hand, a reverberation characteristic reception unit 1410 in the encoding apparatus 1401 receives the reverberation characteristic 1408 of the reproduction environment transmitted from the decoding and reproducing apparatus 1402, and transfers the reverberation characteristic 1408 to the reverberation masking calculation unit 602.

The reverberation masking calculation unit 602 in the encoding apparatus 1401 calculates the characteristic 607 of the reverberation masking by using the input signal, the reverberation characteristic 1408 of the reproduction environment notified from the decoding and reproducing apparatus 1402 side, and the human auditory psychology model prepared in advance. In the second embodiment illustrated in FIG. 6, the reverberation masking calculation unit 602 calculates the characteristic 607 of the reverberation masking by using the reverberation characteristic 609 of the reproduction environment that the reverberation characteristic selection unit 611 reads out from the reverberation characteristic storage unit 612 in accordance with the input type 613 of the reproduction environment. In contrast, in the third embodiment illustrated in FIG. 14, the reverberation characteristic 1408 of the reproduction environment estimated by the decoding and reproducing apparatus 1402 is directly received for the calculation of the characteristic 607 of the reverberation masking. It is thereby possible to calculate the characteristic 607 of the reverberation masking that more matches the reproduction environment and is thus accurate, this leads to more enhanced compression efficiency of the encoded bit stream 1403, an even lower bit rate is enabled.

Figure 15:
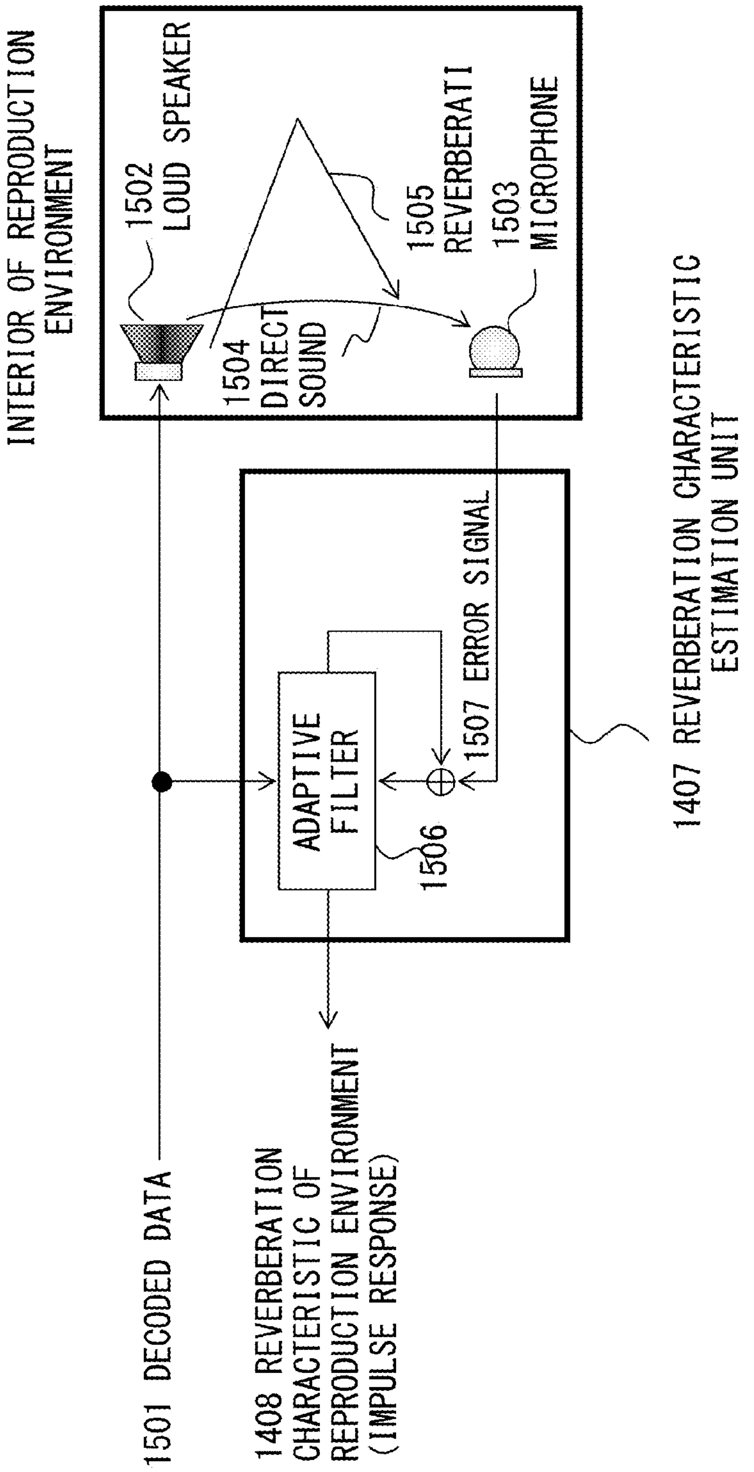
FIG. 15 is a block diagram of a reverberation characteristic estimation unit 1407 of FIG. 14.

FIG. 15 is a block diagram of the reverberation characteristic estimation unit 1407 of FIG. 14.

The reverberation characteristic estimation unit 1407 includes an adaptive filter 1506 for operating by receiving data 1501 that is decoded by the decoding unit 1404 of FIG. 14, a direct sound 1504 emitted by a loud speaker 1502 in the sound emission unit 1405, and a sound that is reverberation 1505 picked up by a microphone 1503 in the sound pickup unit 1406. The adaptive filter 1506 repeats an operation of adding an error signal 1507 output by an adaptive process performed by the adaptive filter 1506 to the sound from the microphone 1503, to estimate the impulse response of the reproduction environment. Then, by inputting an impulse to a filter characteristic on which the adaptive process is completed, the reverberation characteristic 1408 of the reproduction environment is obtained as an impulse response.

Note that, by using the microphone 1503 of which the characteristic is known, the adaptive filter 1506 may operate so as to subtract the known characteristic of the microphone 1503 to estimate the reverberation characteristic 1408 of the reproduction environment.

Accordingly, in the third embodiment, the reverberation characteristic estimation unit 1407 calculates a transfer characteristic of a sound that is emitted by the sound emission unit 1405 and reaches the sound pickup unit 1406 by using the adaptive filter 1506 such that the reverberation characteristic 1408 of the reproduction environment can therefore be estimated with high accuracy.

Figure 16:
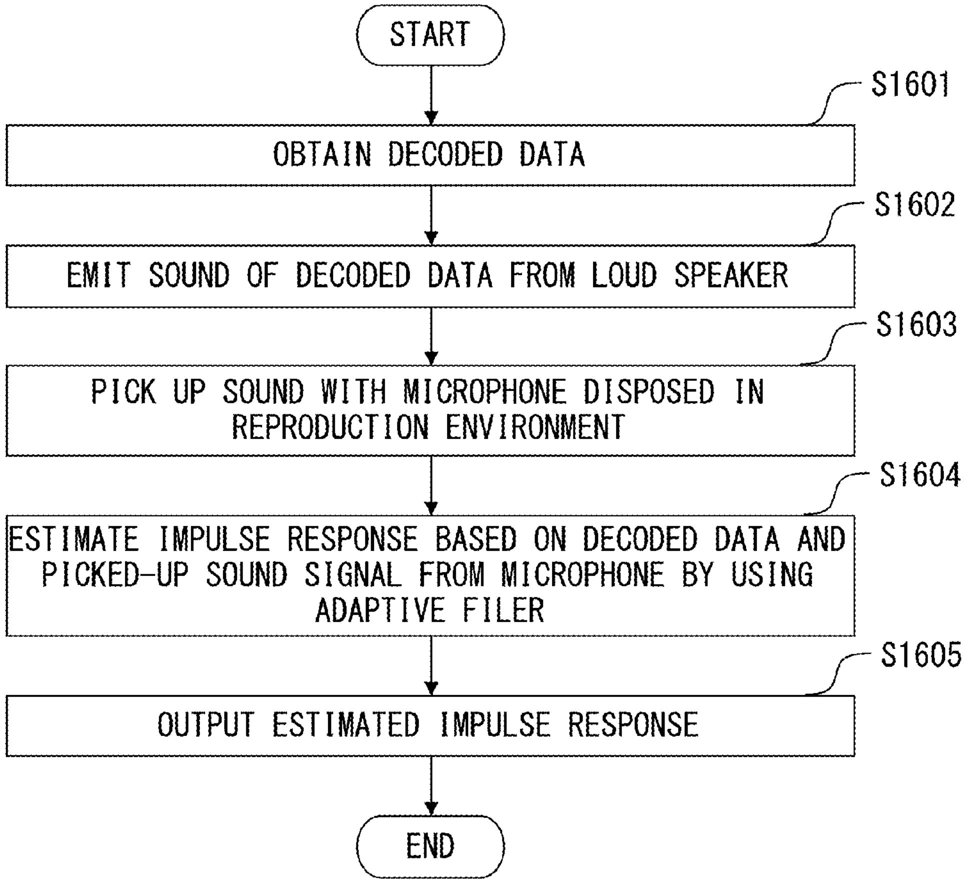
FIG. 16 is a flowchart illustrating a control operation of a device that implements, by means of a software process, the function of the reverberation characteristic estimation unit 1407 illustrated as the configuration of FIG. 15.

FIG. 16 is a flowchart illustrating a control operation of a device that implements, by means of a software process, the function of the reverberation characteristic estimation unit 1407 illustrated as the configuration of FIG. 15. The control operation is implemented as an operation in which a processor (not specially illustrated) that implements the decoding and reproducing apparatus 1402 executes a control program stored in a memory (not specially illustrated).

First, the decoded data 1501 (FIG. 15) is obtained from the decoding unit 1404 of FIG. 14 (step S1601).

Next, the loud speaker 1502 (FIG. 15) emits a sound of the decoded data 1501 (step S1602).

Next, the microphone 1503 disposed in the reproduction environment picks up the sound (step S1603).

Next, the adaptive filter 1506 estimates an impulse response of the reproduction environment based on the decoded data 1501 and a picked-up sound signal from the microphone 1503 (step S1604).

By inputting an impulse to a filter characteristic on which the adaptive process is completed, the reverberation characteristic 1408 of the reproduction environment is output as an impulse response (step S1605).

In the configuration of the third embodiment illustrated in FIG. 14, the reverberation characteristic estimation unit 1407 can operate so as to, on starting the decode of the audio signal, cause the sound emission unit 1405 to emit a test sound prepared in advance, and to cause the sound pickup unit 1406 to pick up the emitted sound, in order to estimate the reverberation characteristic 1408 of the reproduction environment. The test sound may be transmitted from the encoding apparatus 1401, or generated by the decoding and reproducing apparatus 1402 itself. The reverberation characteristic transmission unit 1409 transmits the reverberation characteristic 1408 of the reproduction environment that is estimated by the reverberation characteristic estimation unit 1407 on starting the decode of the audio signal, to the encoding apparatus 1401. On the other hand, the reverberation masking calculation unit 602 in the encoding apparatus 1401 obtains the characteristic 607 of the reverberation masking based on the reverberation characteristic 1408 of the reproduction environment that is received by the reverberation characteristic reception unit 1410 on starting the decode of the audio signal.

Figure 17:
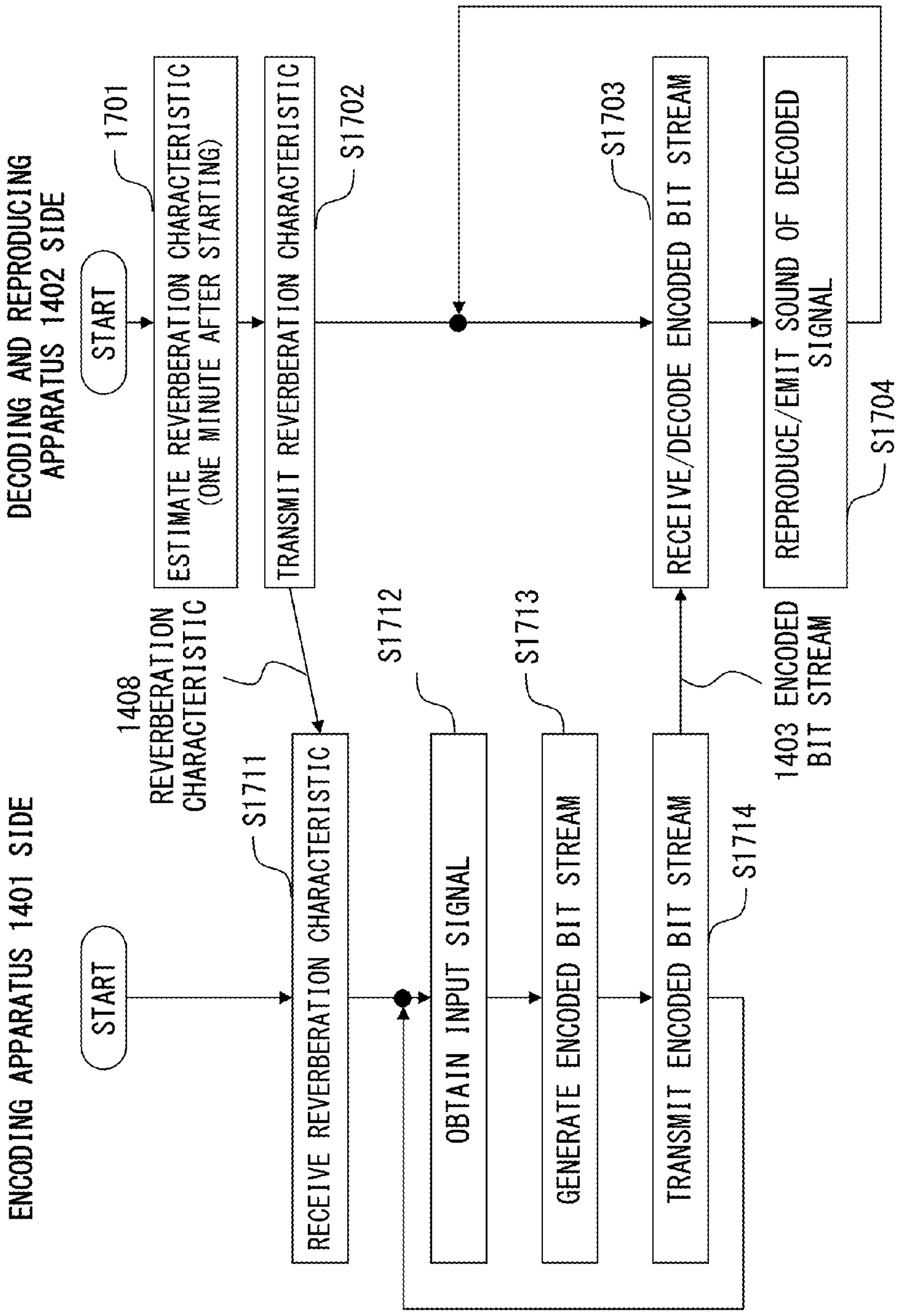
FIG. 17 is a flowchart illustrating a control process of an encoding apparatus 1401 and a decoding and reproducing apparatus 1402 in the case of performing a process in which a reverberation characteristic 1408 of a reproduction environment is transmitted in advance.

FIG. 17 is a flowchart illustrating control processes of the encoding apparatus 1401 and the decoding and reproducing apparatus 1402 in the case of performing a process in which the reverberation characteristic 1408 of the reproduction environment is transmitted in advance, in such a manner. The control processes from the steps S1701 to S1704 are implemented as an operation in which a processor (not specially illustrated) that implements the decoding and reproducing apparatus 1402 executes a control program stored in a memory (not specially illustrated). Moreover, processes from the steps S1711 to S1714 are implemented as an operation in which a processor (not specially illustrated) that implements the encoding apparatus 1401 executes a control program stored in a memory (not specially illustrated).

First, when the decoding and reproducing apparatus 1402 of FIG. 14 starts a decode process, a process for estimating the reverberation characteristic 609 of the reproduction environment is performed on the decoding and reproducing apparatus 1402 side, for one minute, for example, from the start (step S1701). Here, a test sound prepared in advance is emitted from the sound emission unit 1405, and picked up by the sound pickup unit 1406 to estimate the reverberation characteristic 1408 of the reproduction environment. The test sound may be transmitted from the encoding apparatus 1401, or generated by the decoding and reproducing apparatus 1402 itself.

Next, the reverberation characteristic 1408 of the reproduction environment estimated in the step S1701 is transmitted to the encoding apparatus 1401 of FIG. 14 (step S1702).

On the other hand, on the encoding apparatus 1401 side, the reverberation characteristic 1408 of the reproduction environment is received (step S1711). Accordingly, a process is executed in which the aforementioned composite masking characteristic is generated to control the quantization step size, and thus achieving the optimization of the encoding efficiency.

On the encoding apparatus 1401, thereafter, the execution of the following steps is repeatedly started: obtaining an input signal (step S1712), generating the encoded bit stream 1403 (step S1713), and transmitting the encoded bit stream 1403 to the decoding and reproducing apparatus 1402 side (step S1714).

On the decoding and reproducing apparatus 1402 side, the following steps are repeatedly executed: receiving and decoding the encoded bit stream 1403 (step S1703) when the encoded bit stream 1403 is transmitted from the encoding apparatus 1401 side, and reproducing the resulting decoded signal and emitting a sound thereof (step S1704).

With the above advance transmission process of the reverberation characteristic 1408 of the reproduction environment, the audio signal that matches a reproduction environment used by a user can be transmitted.

On the other hand, instead of the aforementioned advance transmission process, the reverberation characteristic estimation unit 1407 can operate so as to, every predetermined period of time, cause the sound emission unit 1405 to emit a reproduced sound of the audio signal decoded by the decoding unit 1404 and cause the sound pickup unit 1406 to picked up the sound, in order to estimate the reverberation characteristic 1408 of the reproduction environment. The predetermined period of time is, for example, 30 minutes. The reverberation characteristic transmission unit 1409 transmits the estimated reverberation characteristic 1408 of the reproduction environment to the encoding apparatus 1401, every time the reverberation characteristic estimation unit 1407 performs the above estimation process. On the other hand, the reverberation masking calculation unit 602 in the encoding apparatus 1401 obtains the characteristic 607 of the reverberation masking every time the reverberation characteristic reception unit 1410 receives the reverberation characteristic 1408 of the reproduction environment. The masking composition unit 603 updates the control of the quantization step size every time the reverberation masking calculation unit 602 obtains the characteristic 607 of the reverberation masking.

Figure 18:
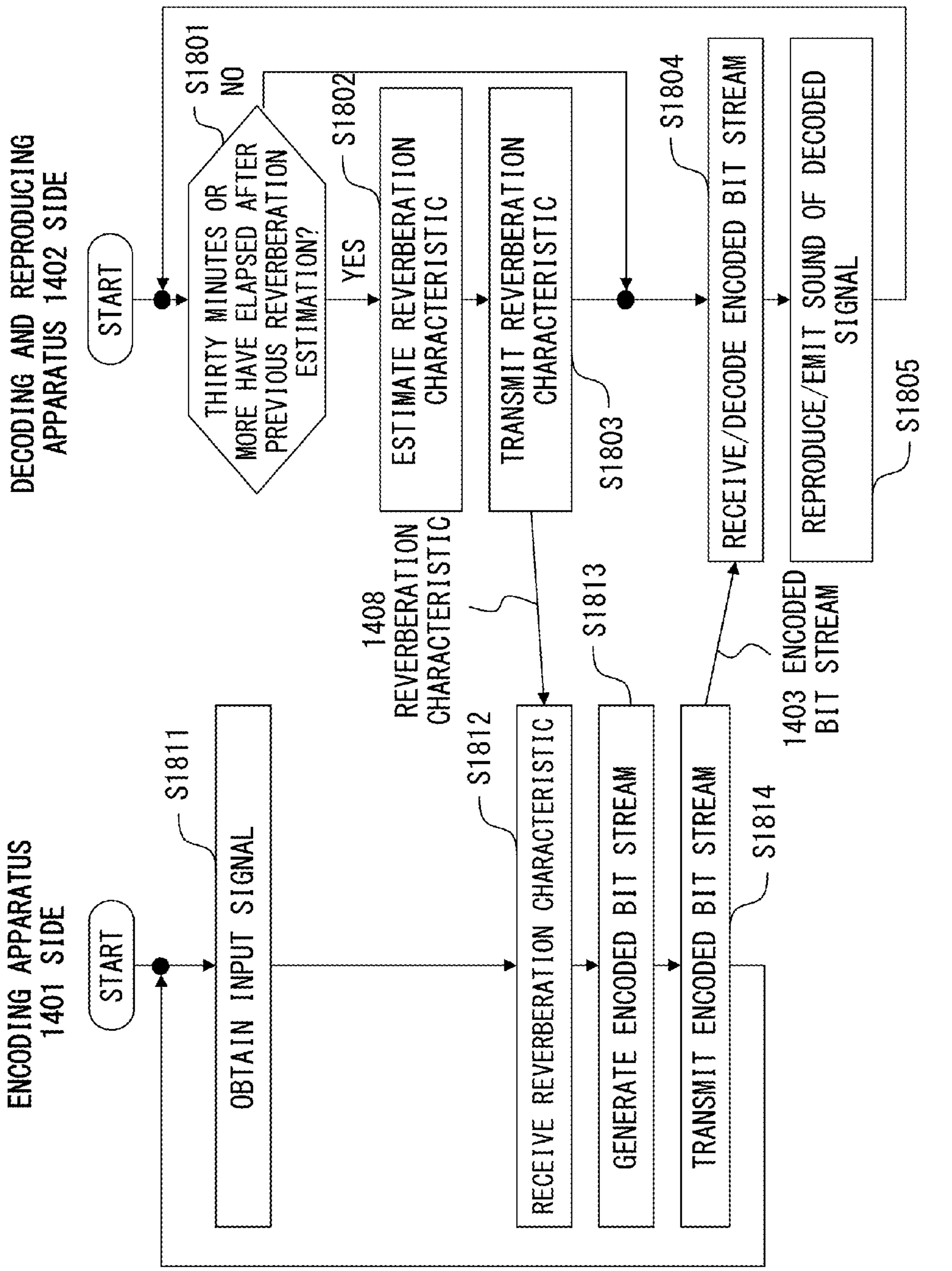
FIG. 18 is a flowchart illustrating a control process of the encoding apparatus 1401 and the decoding and reproducing apparatus 1402 in the case of performing a process in which the reverberation characteristic 1408 of the reproduction environment is transmitted periodically.

FIG. 18 is a flowchart illustrating a control process of the encoding apparatus 1401 and the decoding and reproducing apparatus 1402 in the case of performing a process in which the reverberation characteristic 1408 of the reproduction environment is transmitted periodically, in such a manner. The control processes from the steps S1801 to S1805 are implemented as an operation in which a processor (not specially illustrated) that implements the decoding and reproducing apparatus 1402 executes a control program stored in a memory (not specially illustrated). Moreover, processes from the steps S1811 to S1814 are implemented as an operation in which a processor (not specially illustrated) that implements the encoding apparatus 1401 executes a control program stored in a memory (not specially illustrated).

When the decoding and reproducing apparatus 1402 of FIG. 14 starts the decode process, it is determined whether or not 30 minutes or more, for example, have elapsed after the previous reverberation estimation, on the decoding and reproducing apparatus 1402 side (step S1801).

If the determination in the step S1801 is NO because 30 minutes or more, for example, have not elapsed after previous reverberation estimation, the process proceeds to a step S1804 to execute a normal decode process.

If the determination in the step S1801 is YES because 30 minutes or more, for example, have elapsed after the previous reverberation estimation, a process for estimating the reverberation characteristic 609 of the reproduction environment is performed (step S1802). Here, a decoded sound of the audio signal that the decoding unit 1404 decodes based on the encoded bit stream 1403 transmitted from encoding apparatus 1401 is emitted from the sound emission unit 1405, and picked up by the sound pickup unit 1406, in order to estimate the reverberation characteristic 1408 of the reproduction environment.

Next, the reverberation characteristic 1408 of the reproduction environment estimated in the step S1802 is transmitted to the encoding apparatus 1401 of FIG. 14 (step S1803).

On the encoding apparatus 1401 side, the execution of the following steps is repeatedly started: obtaining an input signal (step S1811), generating the encoded bit stream 1403 (step S1813), and transmitting the encoded bit stream 1403 to the decoding and reproducing apparatus 1402 side (step S1814). In the repeated steps, when the reverberation characteristic 1408 of the reproduction environment is transmitted from the decoding and reproducing apparatus 1402 side, the process is executed in which the reverberation characteristic 1408 of the reproduction environment is received (step S1812). Accordingly, the aforementioned process is updated and executed in which the composite masking characteristic is generated to control the quantization step size.

On the decoding and reproducing apparatus 1402 side, the following steps are repeatedly executed: receiving and decoding the encoded bit stream 1403 when the encoded bit stream 1403 is transmitted from the encoding apparatus 1401 side (step S1804), and reproducing the resulting decoded signal and emitting a sound thereof (step S1805).

With the above periodic transmission process of the reverberation characteristic 1408 of the reproduction environment, even if the reproduction environment used by the user changes over time, the optimization of the encoding efficiency can follow the changes.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An audio signal encoding apparatus comprising:

a processor configured to quantize an audio signal;

to obtain a characteristic of reverberation masking that is exerted on a sound represented by the audio signal by reverberation of the sound generated in a reproduction environment by reproducing the sound; and to control a quantization step size of the audio signal that quantized based on the characteristic of the reverberation masking as estimated based on a transfer characteristic of the sound from a sound emission unit in the reproduction environment to a sound pickup unit in the reproduction environment.

2. The audio signal encoding apparatus according to claim 1, wherein the processor performs control, based on the characteristic of the reverberation masking, so as to make the quantization step size larger in the case where the magnitude of a sound represented by the audio signal is such that the sound is masked by the reverberation, as compared with the case where the magnitude is such that the sound is not masked by the reverberation.

3. The audio signal encoding apparatus according to claim 1, wherein the processor obtains a characteristic of frequency masking that the reverberation exerts on the sound, as the characteristic of the reverberation masking.

4. The audio signal encoding apparatus according to claim 1, wherein the processor obtains a characteristic of temporal masking that the reverberation exerts on the sound, as the characteristic of the reverberation masking.

5. The audio signal encoding apparatus according to claim 1, further comprising the processor obtains a characteristic of auditory masking that a human auditory characteristic exerts on a sound represented by the audio signal, wherein the processor further controls the quantization step size of the audio signal that quantized based also on the characteristic of the auditory masking.

6. The audio signal encoding apparatus according to claim 5, wherein the processor obtains a frequency characteristic of the magnitude of a sound masked by the reverberation, as the characteristic of the reverberation masking, the processor obtains a frequency characteristic of the magnitude of a sound masked by the human auditory characteristic, as the characteristic of the auditory masking, and the processor controls the quantization step size of the audio signal that quantized based on a composite masking characteristic obtained by selecting, for each frequency, a greater characteristic from between a frequency characteristic being the characteristic of the reverberation masking and a frequency characteristic being the characteristic of the auditory masking.

7. An audio signal transmission system comprising:

an encoding apparatus for encoding an audio signal; and a decoding and reproducing apparatus for decoding the audio signal encoded by the encoding apparatus, and reproducing a sound represented by the audio signal in a reproduction environment, wherein the encoding apparatus includes:

a quantizer for quantizing an audio signal;

an audio signal transmission unit for transmitting the quantized audio signal to the decoding and reproducing apparatus;

a reverberation masking characteristic obtaining unit for calculating and obtaining a characteristic of reverberation masking that is exerted on a sound represented by the audio signal by reverberation of the sound generated in the reproduction environment by reproducing the sound, by using the audio signal, a reverberation characteristic of the reproduction environment, and a human auditory psychology model prepared in advance;

a reverberation characteristic reception unit for receiving the reverberation characteristic of the reproduction environment from the decoding and reproducing apparatus; and a control unit for controlling a quantization step size of the quantizer based on the characteristic of the reverberation masking, and the decoding and reproducing apparatus includes:

a decoding unit for decoding the quantized audio signal transmitted from the encoding apparatus;

a sound emission unit for emitting a sound including a sound of the decoded audio signal in the reproduction environment;

a sound pickup unit for picking up the sound emitted by the sound emission unit in the reproduction environment;

an estimation unit for estimating the reverberation characteristic of the reproduction environment based on a transfer characteristic of the sound emitted by the sound emission unit from the sound emission unit to the sound pickup unit; and a reverberation characteristic transmission unit for transmitting the reverberation characteristic of the reproduction environment estimated by the estimation unit to the encoding apparatus.

8. An audio signal encoding method comprising:

quantizing, using a processor, an audio signal;

obtaining, using the processor, a characteristic of reverberation masking that is exerted on a sound represented by the audio signal by reverberation of the sound generated in a reproduction environment by reproducing the sound; and controlling, using the processor, the quantization step size of the audio signal that quantized based on the characteristic of the reverberation masking as estimated based on a transfer characteristic of the sound from a sound emission unit in the reproduction environment to a sound pickup unit in the reproduction environment.

9. An audio signal transmission method comprising:

in an encoding apparatus for encoding an audio signal, receiving, using a processor, the reverberation characteristic of the reproduction environment from a decoding and reproducing apparatus for decoding the audio signal encoded by the encoding apparatus and reproducing a sound represented by the audio signal in a reproduction environment;

calculating and obtaining, using the processor, a characteristic of reverberation masking that is exerted on a sound represented by the audio signal by reverberation of the sound generated in the reproduction environment by reproducing the sound, by using the audio signal, the received reverberation characteristic of the reproduction environment, and a human auditory psychology model prepared in advance;

controlling, using the processor, a quantization step size of a quantizer based on the characteristic of the reverberation masking;

quantizing, using the processor, the audio signal with the quantizer of which the quantization step size is controlled; and transmitting, using the processor, the quantized audio signal to the decoding and reproducing apparatus, and in the decoding and reproducing apparatus, decoding, using the processor, the quantized audio signal transmitted from the encoding apparatus;

emitting, using a sound emission unit, a sound including a sound of the decoded audio signal in the reproduction environment;

picking, using a sound pickup unit, up the emitted sound in the reproduction environment;

estimating, using the processor, the reverberation characteristic of the reproduction environment based on a transfer characteristic of the sound emitted by the sound emission unit from the sound emission unit to the sound pickup unit; and transmitting, using the processor, the estimated reverberation characteristic of the reproduction environment to the encoding apparatus.

10. An audio signal decoding apparatus comprising:

a decoding unit that decodes a quantized audio signal transmitted from an encoding apparatus;

a sound emission unit that emits a sound including a sound of the decoded audio signal in a reproduction environment;

a sound pickup unit that picks up a sound emitted by the sound emission unit, in the reproduction environment;

an estimation unit that estimates the reverberation characteristic of the reproduction environment based on a transfer characteristic of the sound emitted by the sound emission unit from the sound emission unit to the sound pickup unit; and a reverberation characteristic transmission unit that transmits the reverberation characteristic of the reproduction environment estimated by the estimation unit to the encoding apparatus.

* * * * *